(12) United States Patent
Hsieh

(10) Patent No.: US 8,384,194 B2
(45) Date of Patent: Feb. 26, 2013

(54) POWER SEMICONDUCTOR DEVICE COMPRISING A PLURALITY OF TRENCH IGBTS

(75) Inventor: Fu-Yuan Hsieh, Banciao (TW)

(73) Assignee: Force MOS Technology Co., Ltd. (TW)

( * ) Notice: Subject to any disclaimer, the term of this patent is extended or adjusted under 35 U.S.C. 154(b) by 0 days.

(21) Appl. No.: 13/584,937

(22) Filed: Aug. 14, 2012

(65) Prior Publication Data

US 2012/0305985 A1  Dec. 6, 2012

Related U.S. Application Data

(62) Division of application No. 12/659,957, filed on Mar. 26, 2010, now Pat. No. 8,264,035.

(51) Int. Cl.
- *H01L 27/082* (2006.01)
- *H01L 27/102* (2006.01)
- *H01L 29/70* (2006.01)
- *H01L 31/11* (2006.01)

(52) U.S. Cl. ........ 257/589; 257/565; 257/571; 257/578; 257/586; 257/E29.18; 257/E29.197; 257/E29.198; 257/E29.2; 257/E29.201

(58) Field of Classification Search .................. 257/565, 257/571, 578, 586, 589, E29.18, E29.197, 257/E29.198, E29.2, E29.201
See application file for complete search history.

(56) References Cited

U.S. PATENT DOCUMENTS

| | | | | |
|---|---|---|---|---|
| 7,112,843 B2 * | 9/2006 | Takaishi | | 257/330 |
| 7,323,745 B2 * | 1/2008 | Kinzer | | 257/328 |
| 7,633,119 B2 * | 12/2009 | Bhalla et al. | | 257/330 |
| 7,723,782 B2 * | 5/2010 | Hirler | | 257/330 |
| 7,800,183 B2 * | 9/2010 | Okuno et al. | | 257/370 |
| 7,893,457 B2 * | 2/2011 | Madathil et al. | | 257/133 |
| 7,999,345 B2 * | 8/2011 | Nakazawa et al. | | 257/471 |
| 8,022,476 B2 * | 9/2011 | Pang | | 257/334 |
| 8,072,000 B2 * | 12/2011 | Hsieh | | 257/139 |
| 8,097,917 B2 * | 1/2012 | Kumar et al. | | 257/332 |
| 8,143,124 B2 * | 3/2012 | Challa et al. | | 438/270 |
| 2009/0283797 A1 * | 11/2009 | Takahashi et al. | | 257/139 |

* cited by examiner

*Primary Examiner* — Ida M Soward
(74) *Attorney, Agent, or Firm* — Bacon & Thomas, PLLC

(57) ABSTRACT

A power semiconductor device with improved avalanche capability structures is disclosed. By forming at least an avalanche capability enhancement doped regions with opposite conductivity type to epitaxial layer underneath an ohmic contact doped region which surrounds at least bottom of trenched contact filled with metal plug between two adjacent gate trenches, avalanche current is enhanced with the disclosed structures.

13 Claims, 24 Drawing Sheets

US 8,384,194 B2

POWER SEMICONDUCTOR DEVICE COMPRISING A PLURALITY OF TRENCH IGBTS

This application is a divisional application of pending U.S. patent application Ser. No. 12/659,957, filed Mar. 26, 2010 (of which the entire disclosure of the pending, prior application is hereby incorporated by reference).

FIELD OF THE INVENTION

This invention related generally to the cell structure and device configuration of power semiconductor devices. More particularly, this invention relates to power semiconductor devices with improved avalanche capability.

BACKGROUND OF THE INVENTION

In U.S. Pat. No. 6,888,196, a conventional structure of power semiconductor device is disclosed, as shown in FIG. 1, wherein an N-channel trench MOSFET comprising a plurality of trenched gates 110 surrounded by n+ source regions 112 encompassed in P body regions 114 is formed in an N epitaxial layer 102 over an N+ substrate 100. To connect said source regions 112 and said body regions 114 to a source metal 122, a trenched source-body contact 118 with vertical sidewall is employed penetrating through a contact interlayer 120, said n+ source regions 112 and extending into said P body regions 114. Furthermore, a p+ body ohmic contact doped region 116 is implanted surrounding bottom of said trenched source-body contact to decrease a contact resistance between said P body regions 114 and said trenched source-body contact 118.

The conventional structure in FIG. 1 is accoutering a technical difficulty which is that avalanche always occurs near bottom of said trenched gates 110, causing a hazardous condition to the power semiconductor device. As we all know that, in the trench MOSFET shown in FIG. 1, a avalanche current Iav (illustrated in FIG. 1) flows between said trenched gates 110 and said source-body contact 118, triggering turning-on of a parasitic bipolar transistor (illustrated in FIG. 1) when Iav*Rb>0.7V, wherein Rb is a resistance between said p+ body ohmic contact doped region 116 and channel region near said trenched gates 110. As is known to all that, the doping concentration of said p+ body ohmic contact doped region 116 is higher than that of said P body region 114 (please refer to FIG. 2 for $Y_1$-$Y_1'$ cross section of FIG. 1), which is helpful to decrease resistance Rb, however, as the sidewall of said trenched source-body contact is perpendicular to the front surface of said N epitaxial layer 102, when carrying out implantation through a contact trench, said p+ body ohmic contact doped region 116 can be formed only surrounding bottom of said trenched source-body contact, resulting in a high resistance Rb underneath said n+ source regions 112. Therefore, said parasitic bipolar transistor is easily to be triggered turning on due to the high resistance Rb, thus weakening the avalanche capability of the trench MOSFET.

FIG. 3 shows another trench MOSFET in prior art disclosed in U.S. Patent No. 20080890357. Comparing to FIG. 1, the trench MOSFET in FIG. 3 comprises a plurality of trenched gates 130 having terrace gate structure for gate resistance reduction, wherein top surface of gate conductive layer filled in gate trenches is higher than the sidewall. However, the limitation of poor avalanche capability discussed above is still pronounced in this structure due to the easily turning-on of a parasitic bipolar transistor and the occurring of avalanche near bottom of said trenched gates 130.

For other power semiconductor power device, for example trench IGBTs, the same disadvantage of poor avalanche capability is also affecting the performance of the power semiconductor device.

Accordingly, it would be desirable to provide new and improved power semiconductor devices to avoid the constraint discussed above.

SUMMARY OF THE INVENTION

The present invention has been conceived to solve the above-described problems with the related art, and it is an object of the invention to provide a technique which makes it possible to avoid the avalanche occurring near bottom of the trenched gates and to prevent the parasitic bipolar transistor from turning-on.

In order to solve the above-described problems, according to a first aspect of the invention, there is provided a power semiconductor device comprising a plurality of trench MOSFETs wherein each of said trench MOSFETs comprising: a substrate of a first conductivity type; an epitaxial layer of said first conductivity type over said substrate, wherein said epitaxial layer has a lower doping concentration than said substrate; a plurality of gate trenches extending into said epitaxial layer, wherein each of said gate trenches has a first insulation layer lining its inner surface and a doped poly-silicon layer thereon; a body region of a second conductivity type surrounding sidewall of each of said gate trenches between every two adjacent of said gate trenches; a source region of said first conductivity type near top surface of each said body region, wherein said source region surrounds top portion of sidewall of each of said gate trenches, and has a higher doping concentration than said epitaxial layer; a second insulation layer disposed over said epitaxial layer and covering outer surface of said doped poly-silicon layer; a source-body contact trench locating between every two adjacent of said gate trenches, opened through said second insulation layer and said source region, and extended into said body region; a body ohmic contact doped region of said second conductivity type formed within said body region, surrounding at least bottom of each said source-body contact trench, wherein said body ohmic contact doped region has a higher doping concentration than said body region; at least an avalanche capability enhancement doped region of said second conductivity type underneath each said body ohmic contact doped region, wherein said avalanche capability enhancement region has a higher doping concentration than said body region but a lower doping concentration than said body ohmic contact doped region; a metal plug filled in each said source-body contact trench; a source metal disposed covering top surface of said second insulation layer; a drain metal disposed on rear side of said substrate.

Firstly, said at least one avalanche capability enhancement doped region is formed underneath said body ohmic contact doped region. Second, as Unclamp Inductive Switching (UIS) test is used to evaluate avalanche capability by measuring UIS current at breakdown voltage, in FIG. 4, by adding a P* avalanche capability enhancement region underneath a p+ body ohmic contact doped region (please refer to FIG. 5 for $Y_2$-$Y_2'$ cross section of FIG. 4), the avalanche current Iav is shifted from bottom of said gate trenches to underneath said source-body contact trench so that the avalanche current Iav directly flows to said source metal to enhance UIS current (as shown in FIG. 6) at expense of slight degradation of breakdown voltage (as shown in FIG. 7) for depth of said body regions less than 1.0 µm but not affect on breakdown voltage for depth of said body regions greater than 1.0 µm.

According to a second aspect of the present invention, there is provided a power semiconductor device comprising a plurality of trench MOSFETs wherein there is only one said avalanche capability enhancement doped region underneath each said body ohmic contact doped region, wherein said avalanche capability enhancement doped region is formed completely within said body region.

According to a third aspect of the present invention, there is provided a power semiconductor device comprising a plurality of trench MOSFETs wherein there is only one said avalanche capability enhancement doped region underneath each said body ohmic contact doped region, wherein said avalanche capability enhancement doped region is formed partially overlap with said body region and partially extending into said epitaxial layer but shallower than said gate trenches.

According to a fourth aspect of the present invention, there is provided a power semiconductor device comprising a plurality of trench MOSFETs wherein there are multiple of avalanche capability enhancement doped regions, and one of which is formed partially overlap with said body region and partially extending into said epitaxial layer but shallower than said gate trenches and others are disposed within said body region, for example in FIG. 9 having two avalanche capability enhancement doped regions. Please refer to FIG. 10 for the $Y_3$-$Y_3'$ cross section of FIG. 9.

According to a fifth aspect of the present invention, there is provided a power semiconductor device comprising a plurality of trench MOSFETs wherein said doped poly-silicon layer protrudes out from each of said gate trenches and at least a portion of said doped poly-silicon is positioned higher than sidewall of each of said gate trenches.

According to a sixth aspect of the present invention, there is provided a power semiconductor device comprising a plurality of trench MOSFETs wherein top surface of said doped poly-silicon layer is not higher than the sidewall of each of said gate trenches.

According to a seventh aspect of the present invention, there is provided a power semiconductor device comprising a plurality of trench MOSFETs wherein each said source-body contact trench has sidewalls with taper angle $\alpha_1$ within said source region, and has sidewalls with taper angle $\alpha_2$ in said body region with respect to top surface of said epitaxial layer, wherein said taper angle $\alpha_1$ is equal to or less than 90 degree and equal to or greater than said taper angle $\alpha_2$. By employing this structure with said taper angle $\alpha_2$ is less than 90 degree, the area of said body ohmic contact doped region is enlarged surrounding not only bottom but also sidewall of each said source-body contact trench, thus further enhancing UIS performance.

According to an eighth aspect of the present invention, there is provided a power semiconductor device comprising a plurality of trench IGBTs (Insulating Gate Bipolar Transistors) wherein each of said trench IGBTs comprising: a first epitaxial layer of a first conductivity type over a substrate of a second conductivity type; a second epitaxial layer of said first conductivity type, wherein said second epitaxial layer has a lower doping concentration than said first epitaxial layer; a plurality of gate trenches extending into said second epitaxial layer, wherein each of said gate trenches has a first insulation layer lining its inner surface and a doped poly-silicon layer thereon; a base region of said second conductivity type surrounding sidewall of each of said gate trenches between every two adjacent of said gate trenches, wherein said base regions has a lower doping concentration than said substrate; an emitter region of said first conductivity type near top surface of said base region, wherein said emitter region surrounds top portion of sidewall of each of said gate trenches, and said emitter region has a higher doping concentration than said second epitaxial layer; a second insulation layer disposed over said second epitaxial layer and covering outer surface of said doped poly-silicon layer; an emitter-base contact trench locating between every two adjacent of said gate trenches, opened through said second insulation layer and said emitter region and extending into said base region; a base ohmic contact doped region of said second conductivity type formed within said base region, surrounding at least bottom of each said emitter-base contact trench, wherein said base ohmic contact doped region has a higher doping concentration than said base region; at least an avalanche capability enhancement doped region of said second conductivity type underneath each said base ohmic contact doped region, wherein said avalanche capability enhancement doped region has a higher doping concentration than said base region but a lower doping concentration than said base ohmic contact doped region; a metal plug filling in each said emitter-base contact trench; an emitter metal disposed covering top surface of said second insulation layer; a collector metal disposed on rear side of said substrate.

According to a ninth aspect of the present invention, there is provided a power semiconductor device comprising a plurality of trench IGBTs wherein there is only one said avalanche capability enhancement doped region underneath each said base ohmic contact doped region, wherein said avalanche capability enhancement doped region is formed completely within said base region.

According to a tenth aspect of the present invention, there is provided a power semiconductor device comprising a plurality of trench IGBTs wherein there is only one said avalanche capability enhancement doped region underneath each said base ohmic contact doped region, wherein said avalanche capability enhancement doped region is formed partially overlap with said base region and partially extending into said second epitaxial layer but shallower than said gate trenches.

According to an eleventh aspect of the present invention, there is provided a power semiconductor device comprising a plurality of trench IGBTs wherein there area multiple of base doped areas, and one of which is formed partially overlap with said base regions and partially extending into said second epitaxial layer but shallower than said gate trenches.

According to a twelfth aspect of the present invention, there is provided a power semiconductor device comprising a plurality of trench IGBTs wherein said doped poly-silicon layer protrudes out from each of said gate trenches and at least a portion of said doped poly-silicon is positioned higher than sidewall of each of said gate trenches.

According to a thirteenth aspect of the present invention, there is provided a power semiconductor device comprising a plurality of trench IGBTs wherein top surface of said doped poly-silicon layer is not higher than sidewall of each of said gate trenches.

According to a fourteenth aspect of the present invention, there is provided a power semiconductor device comprising a plurality of trench IGBTs wherein each said emitter-base contact trench has sidewalls with taper angle $\alpha_1$ within said second insulation layer and said emitter region, and has sidewalls with taper angle $\alpha_2$ in said base region with respect to top surface of said second epitaxial layer, wherein said taper angle $\alpha_1$ is equal to or less than 90 degree and equal to or greater than said taper angle $\alpha_2$.

According to a fifteenth aspect of the present invention, there is provided a method of manufacturing a power semiconductor device comprising: forming a trench mask over top surface of an epitaxial layer, the trench mask having apertures defining the location of a plurality of gate trenches; etching through the apertures in the trench mask to form a plurality of gate trenches in the epitaxial layer; removing the trench mask; forming a first insulation layer on inner surface of said gate trenches; depositing a gate conductive layer such that said gate conductive layer overflows onto top surface of said epitaxial layer; etching or CMP (Chemical Mechanical Polishing) said gate conductive layer such that said gate conductive layer is removed away from the top surface of said epitaxial layer; carrying out ion implantation with dopant type opposite to said epitaxial layer to form a plurality of first doped regions extending between every two adjacent of said gate trenches; forming implantation mask over the top surface of said epitaxial layer, wherein the implantation mask has apertures defining location of a plurality of second doped regions in active area; carrying out ion implantation with dopant type same as said epitaxial layer such that said second doped regions are formed near top surface of said first doped regions; depositing a second insulation layer over the top surface of said epitaxial layer; forming a contact mask over said second insulation layer, the contact mask having apertures defining location of a plurality of first-second-doped-regions contact trenches; etching said second insulation layer and said epitaxial layer through the apertures in said contact mask such that the first-second-doped-regions contact trenches have sidewalls in said second doped regions with taper angle $\alpha_1$, and have sidewalls in said first doped regions with taper angle $\alpha_2$ with respect to the top surface of said epitaxial layer, wherein $\alpha_1$ is equal to or less than 90 degree and equal to or greater than $\alpha_2$; carrying out ion implantation with dopant type opposite to said epitaxial layer over entire top surface of said second insulation layer to form a third doped region surrounding the bottom and sidewall of each of said first-second doped regions contact trenches within said first doped regions; carrying out at least one ion implantation with dopant type opposite to said epitaxial layer to form at least one fourth doped region underneath said third doped region.

According to a sixteenth aspect of the present invention, there is provided a method of manufacturing a power semiconductor device, wherein said ion implantation for formation of at least one fourth doped region is carried out with energy ranging from 100 KeV to 300 KeV and with dose from 1E12 to 1E14 $cm^{-2}$.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
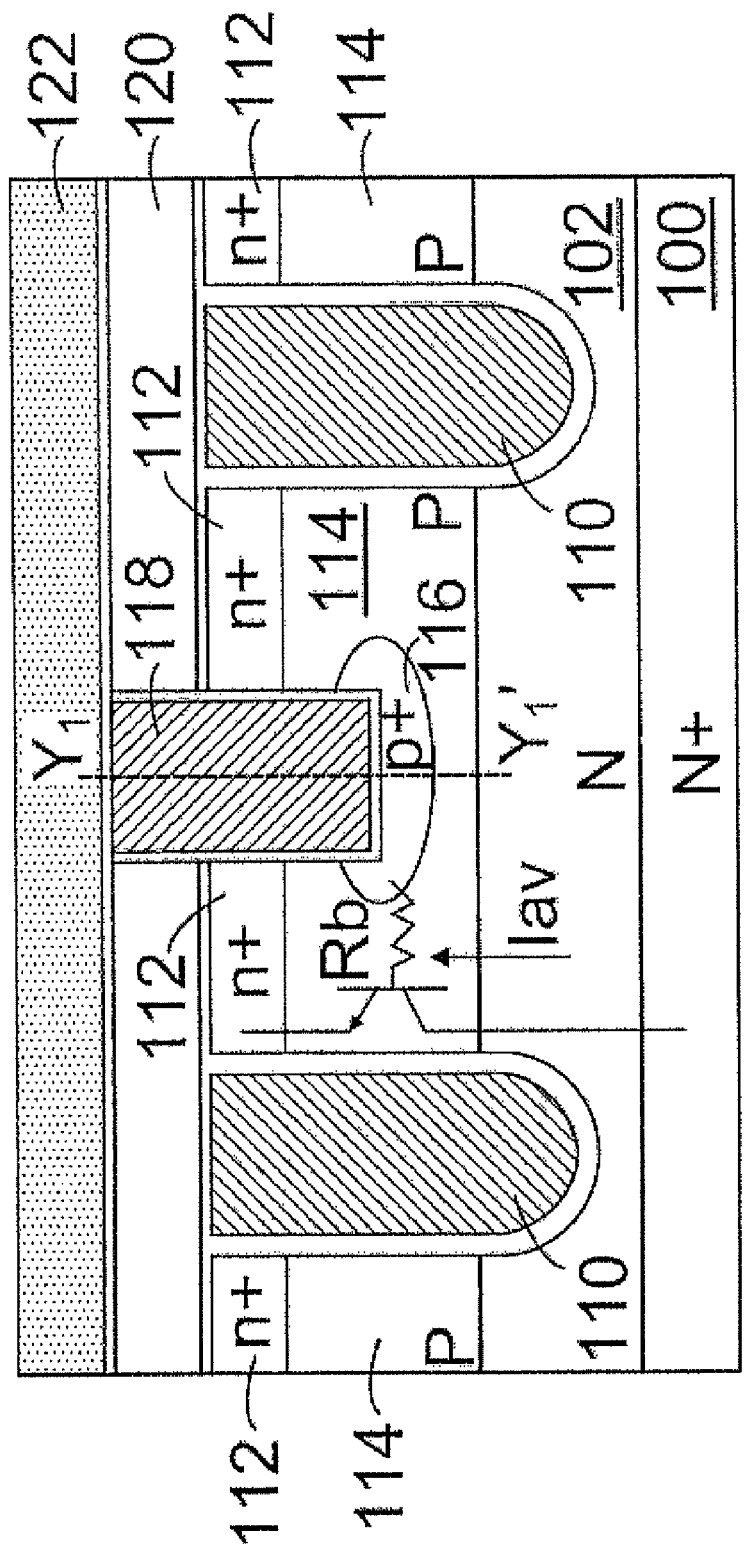
FIG. 1 is a side cross-sectional view of a power semiconductor device of prior art.
Figure 2:
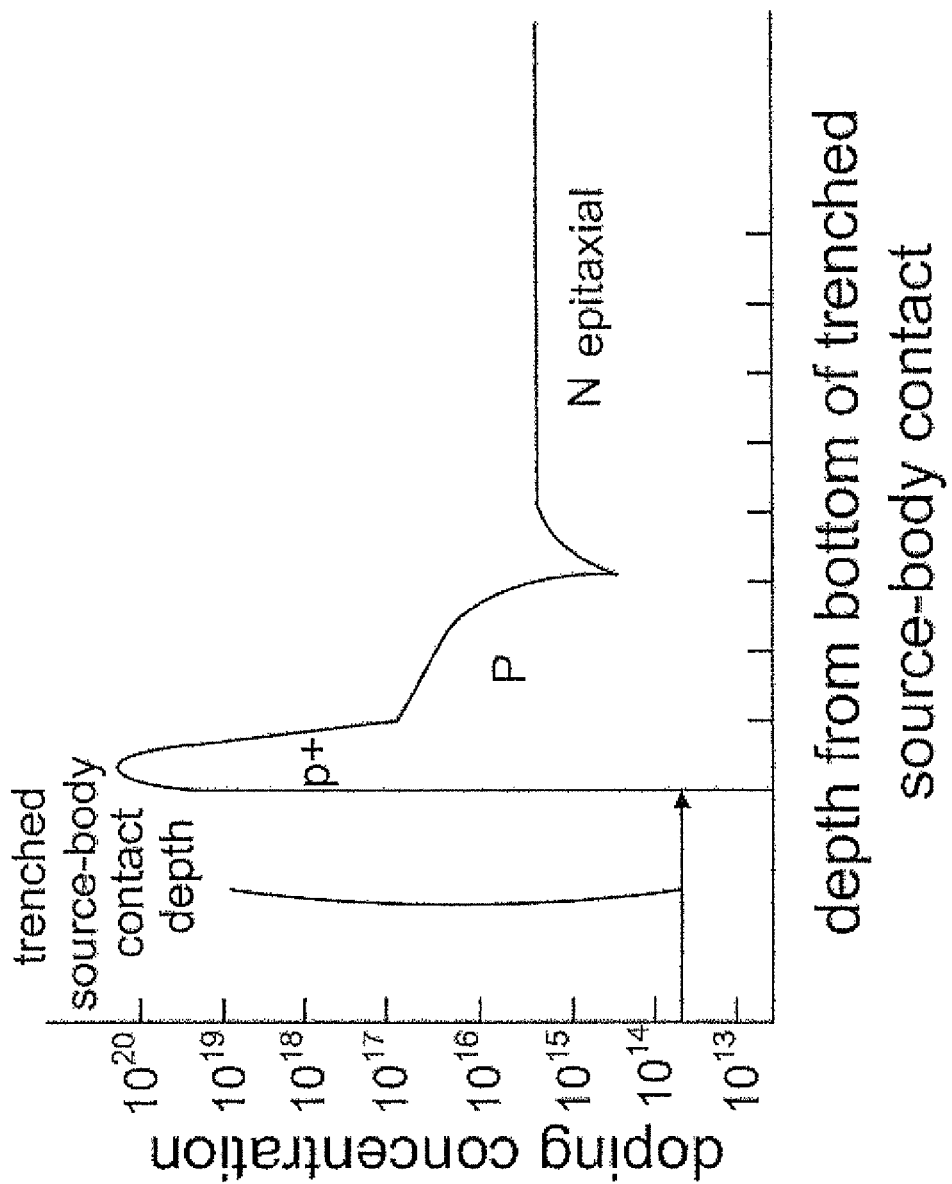
FIG. 2 is a graph showing $Y_1$-$Y_1'$ cross section of FIG. 1.
Figure 3:
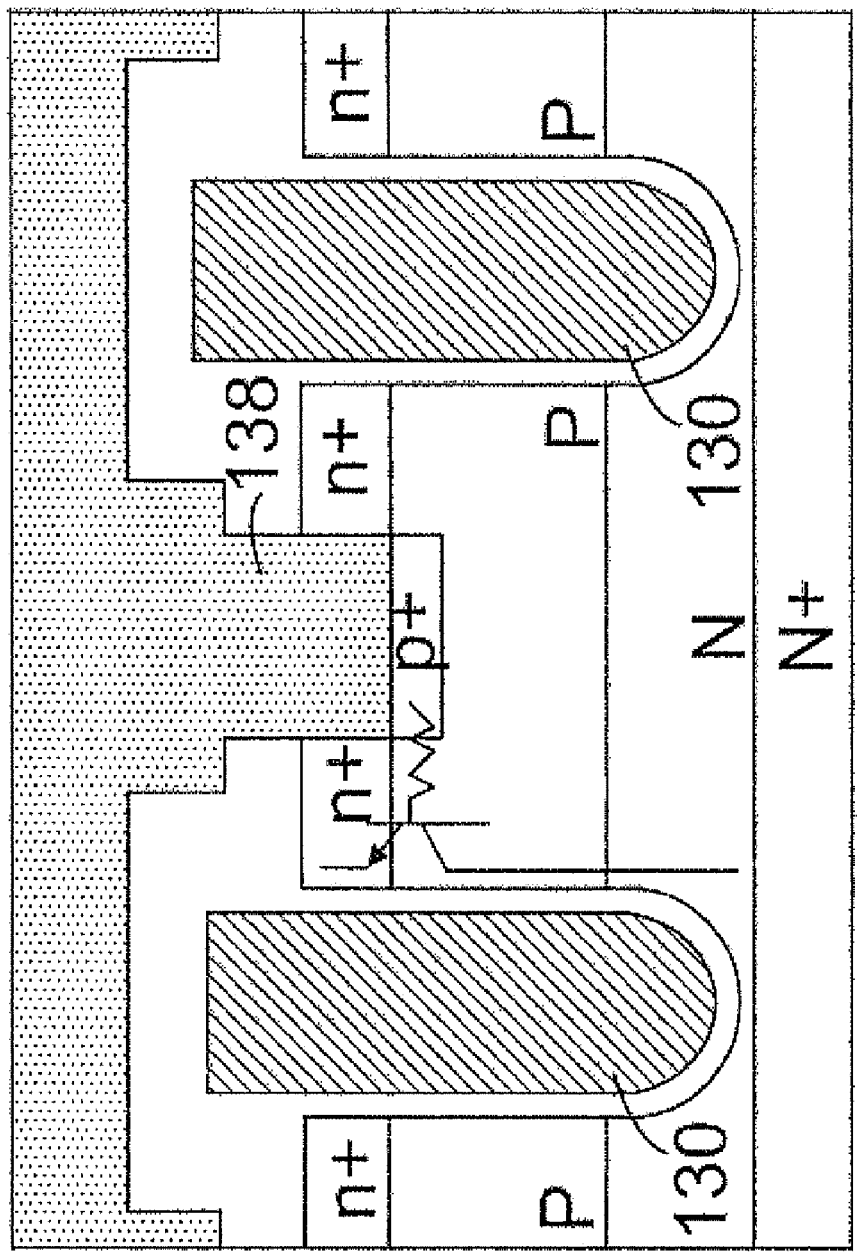
FIG. 3 is a side cross-sectional view of a power semiconductor device of another prior art.
Figure 4:
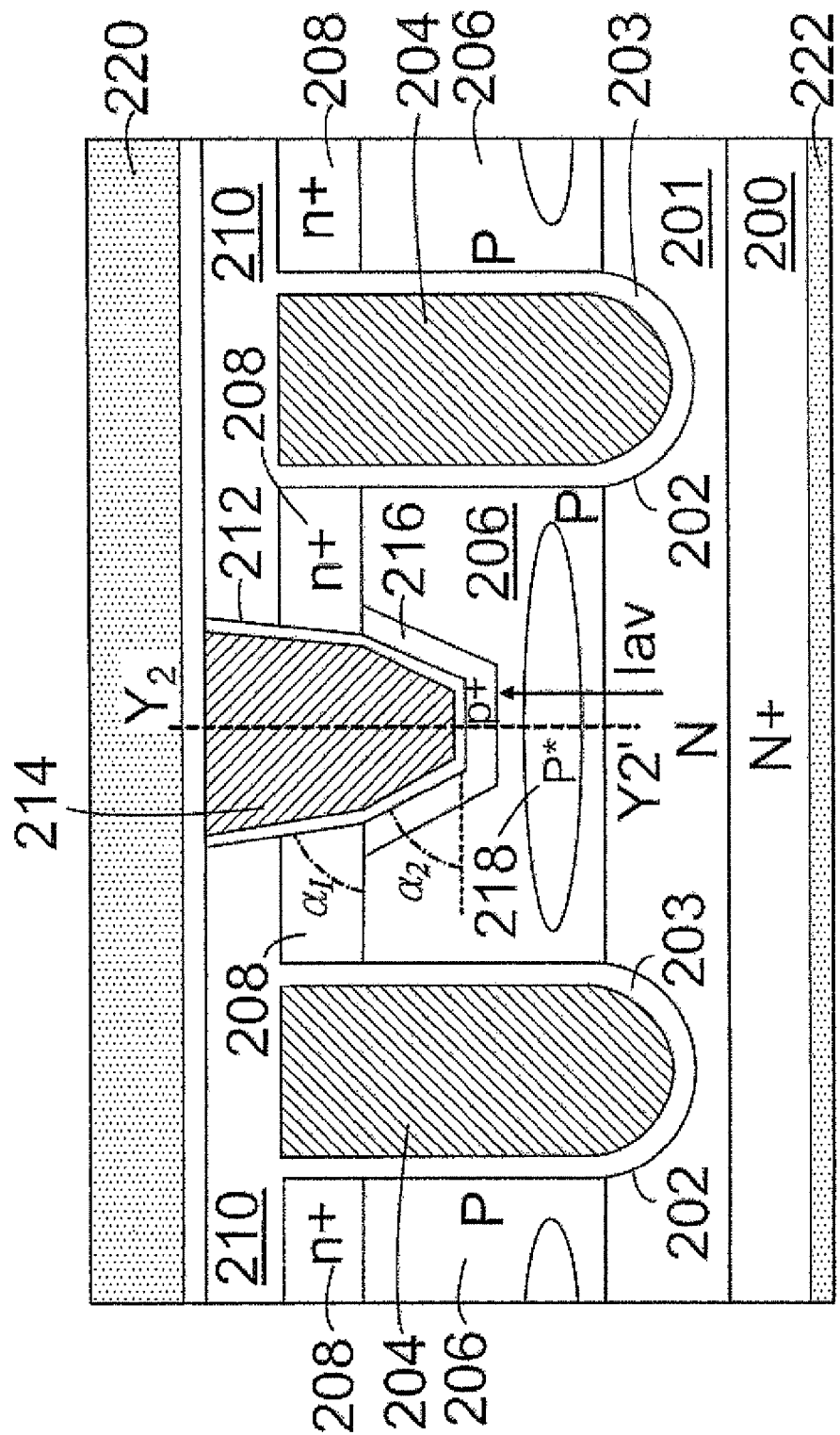
FIG. 4 is a side cross-sectional view of a preferred embodiment according to the present invention.
Figure 5:
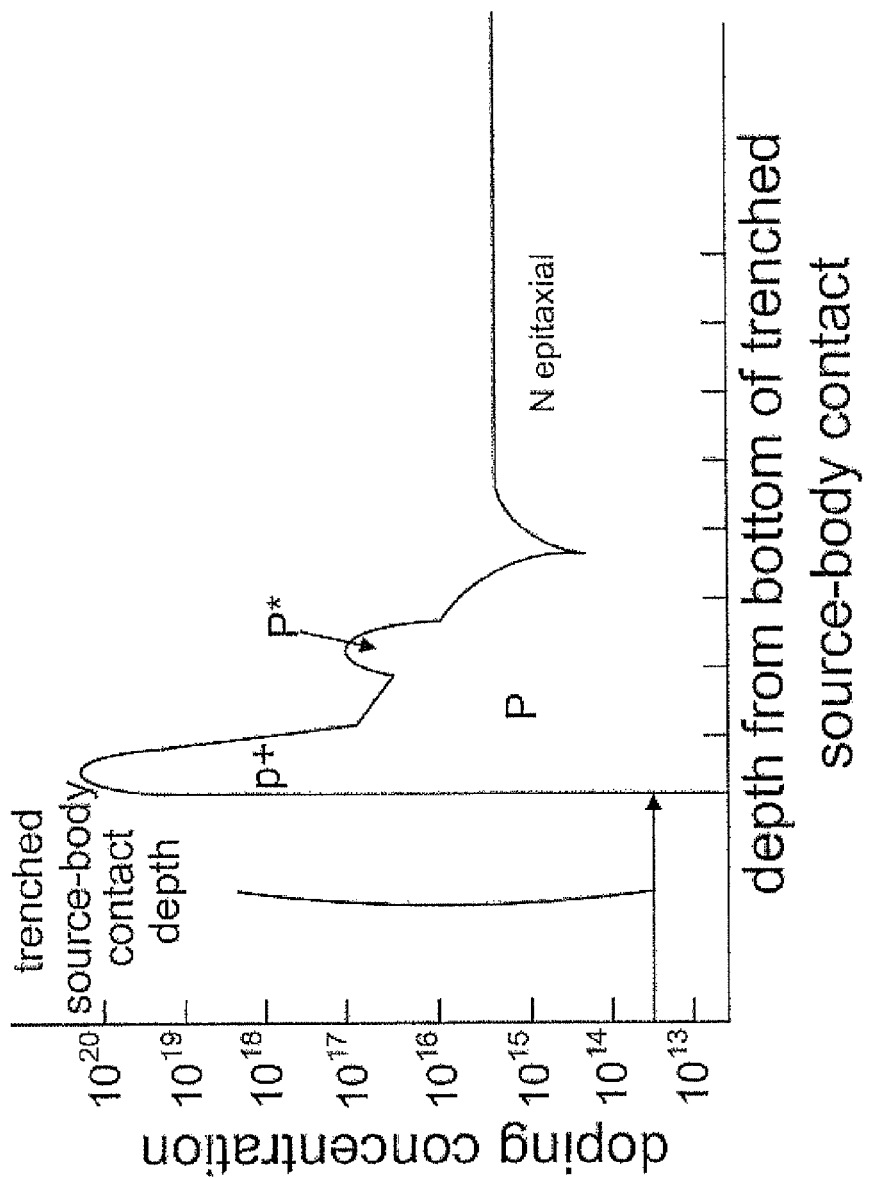
FIG. 5 is a graph showing $Y_2$-$Y_2'$ cross section of FIG. 4
Figure 6:
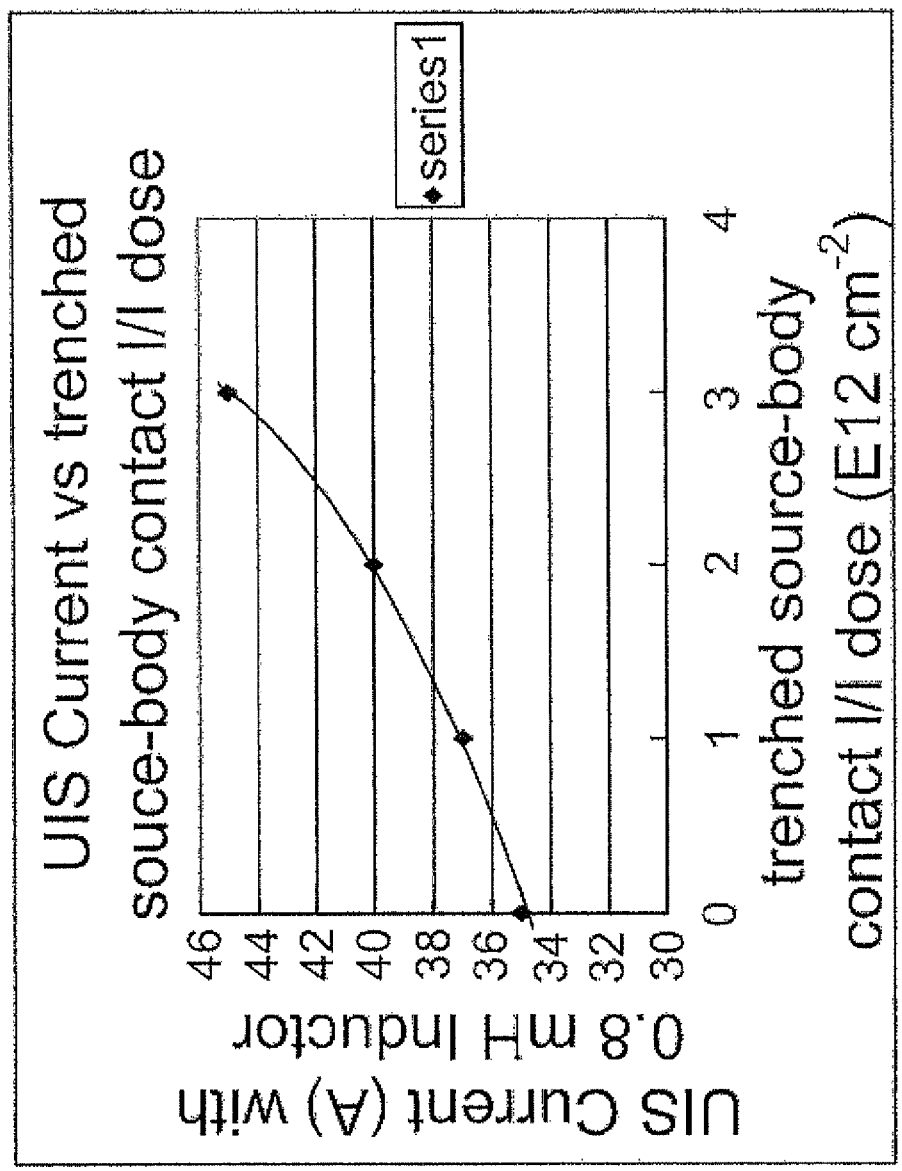
FIG. 6 is a graph showing relationship between UIS current and dose of ion implantation through trenched source-body contact for formation of an avalanche capability enhancement doped region.
Figure 7:
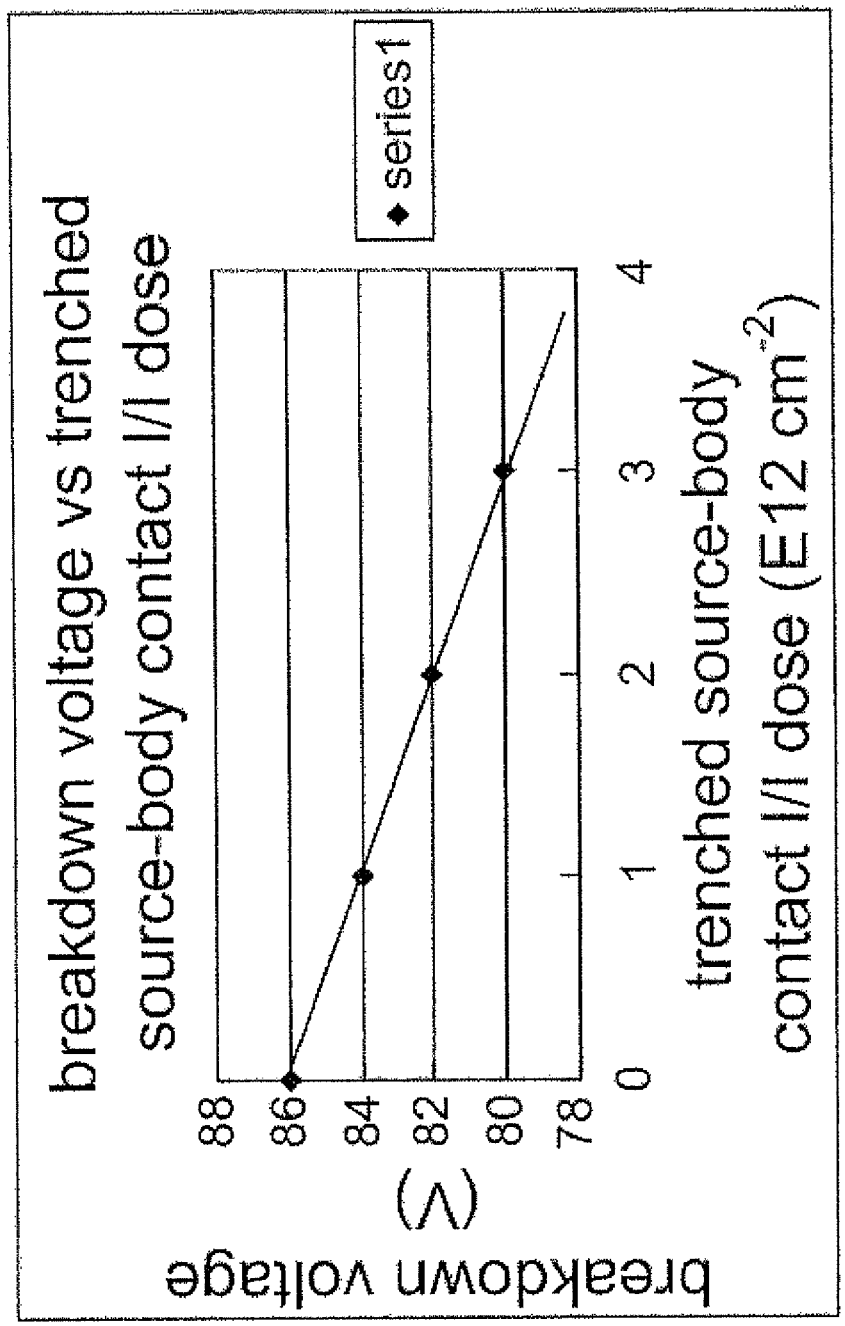
FIG. 7 is a graph showing relationship between breakdown voltage and dose of ion implantation through trenched source-body contact for formation of an avalanche capability enhancement doped region.

Please refer to FIG. 4 for a cross sectional-view of a preferred N-channel trench MOSFET which formed on an N+ substrate 200 with back metal 222 of Ti/Ni/Ag on rear side as drain electrode. Onto said N+ substrate 200, a lighter doped N epitaxial layer 201 is grown, and a plurality of trenched gates are formed therein. The trenched gates further comprises: a plurality of gate trenches 202; a gate oxide layer 203 lining the inner surface of each of said gate trenches 202; a doped poly-silicon layer 204 filled in each of said gate trenches, wherein the top surface of said doped poly-silicon layer 204 not higher than sidewalls of said gate trenches. The preferred N-channel trench MOSFET further comprises: P body regions 206 formed in upper portion of said N epitaxial layer 201 and extending between every two adjacent of said gate trenches 202; n+ source regions 208 near top surface of said P body regions 206 and surrounding the sidewalls of said gate trenches 202; an insulation layer serving as contact interlayer 210 covering top surface of said N epitaxial layer 201 and said doped poly-silicon layer 204; a plurality of trenched source-body contacts including a plurality of source-body contact trenches 212 and a plurality of tungsten plugs 214 therein, wherein each of said tungsten plugs 214 is padded by a barrier layer of Ti/TiN or Co/TiN or Ta/TiN. Specifically, each of said source-body contact trenches has slope sidewall penetrating through said contact interlayer 210 and said n+ source regions 208 with taper angle $\alpha_1$, and extending into said P body regions with taper angle $\alpha_2$, wherein $\alpha_1$ is less than 90 degree and greater than $\alpha_2$. Therefore, underneath each of said source-body contact trenches 212, a p+ body ohmic contact doped region 216 is surrounding its bottom and the sidewall with taper angle $\alpha_2$ due to the enlargement of implantation area. According to the present invention, in this preferred embodiment, there is only one P* avalanche capability enhancement doped region 218 underneath said p+ body ohmic contact doped region 216 and completely within said P body regions 206 to shift avalanche occurrence from bottom of said gate trenches to underneath said source-body contact trenches. Onto said contact interlayer 210 and said tungsten plugs 214, a front metal of Al alloys or Cu alloys is deposited acting as source metal 220 to be connected to said n+ source regions 208 and said P body regions 206 via said tungsten plugs 214, wherein said source metal 220 is padded by a resistance-reduction layer of Ti or Ti/TiN beneath.

Figure 8:
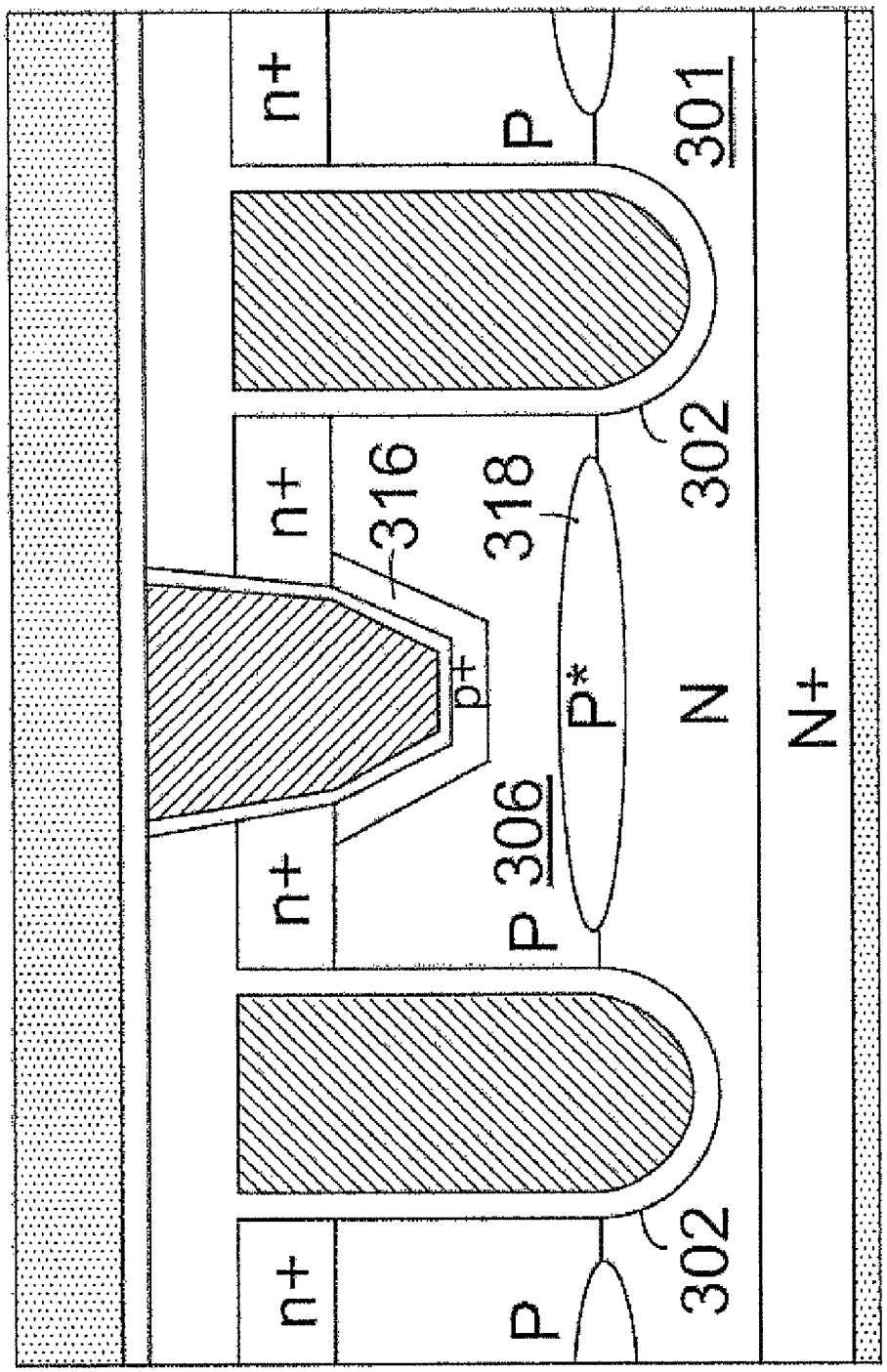
FIG. 8 is a side cross-sectional view of another preferred embodiment according to the present invention.

Please refer to FIG. 8 for a cross sectional-view of another preferred N-channel trench MOSFET which is similar to that in FIG. 4 except that, underneath the p+ body ohmic contact doped region 316, the P* avalanche capability enhancement doped region 318 is formed partially overlap with the P body region 306 and partially extending into the N epitaxial layer 301 but shallower than the gate trenches 302.

Figure 9:
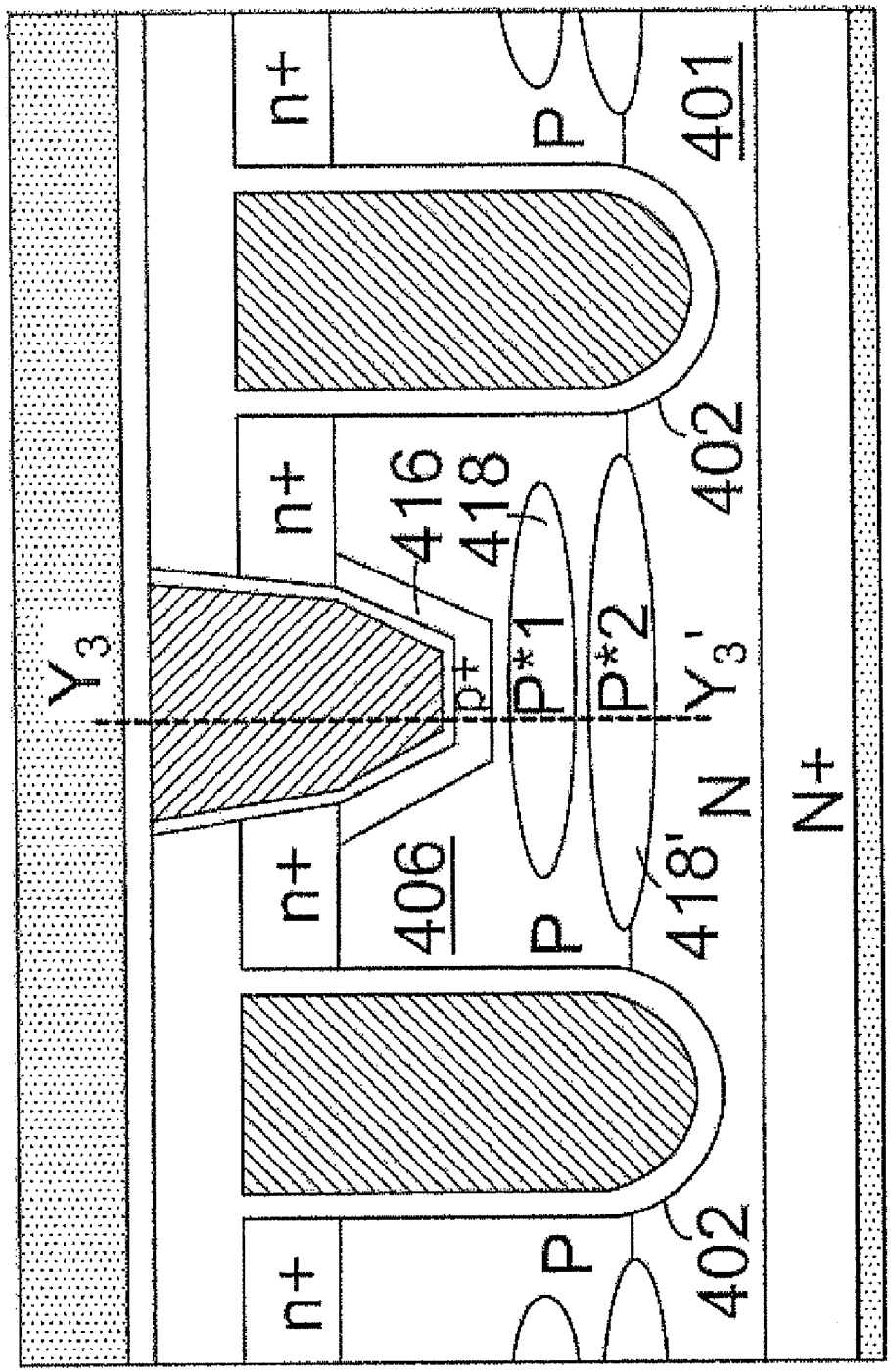
FIG. 9 is a side cross-sectional view of another preferred embodiment according to the present invention.
Figure 10:
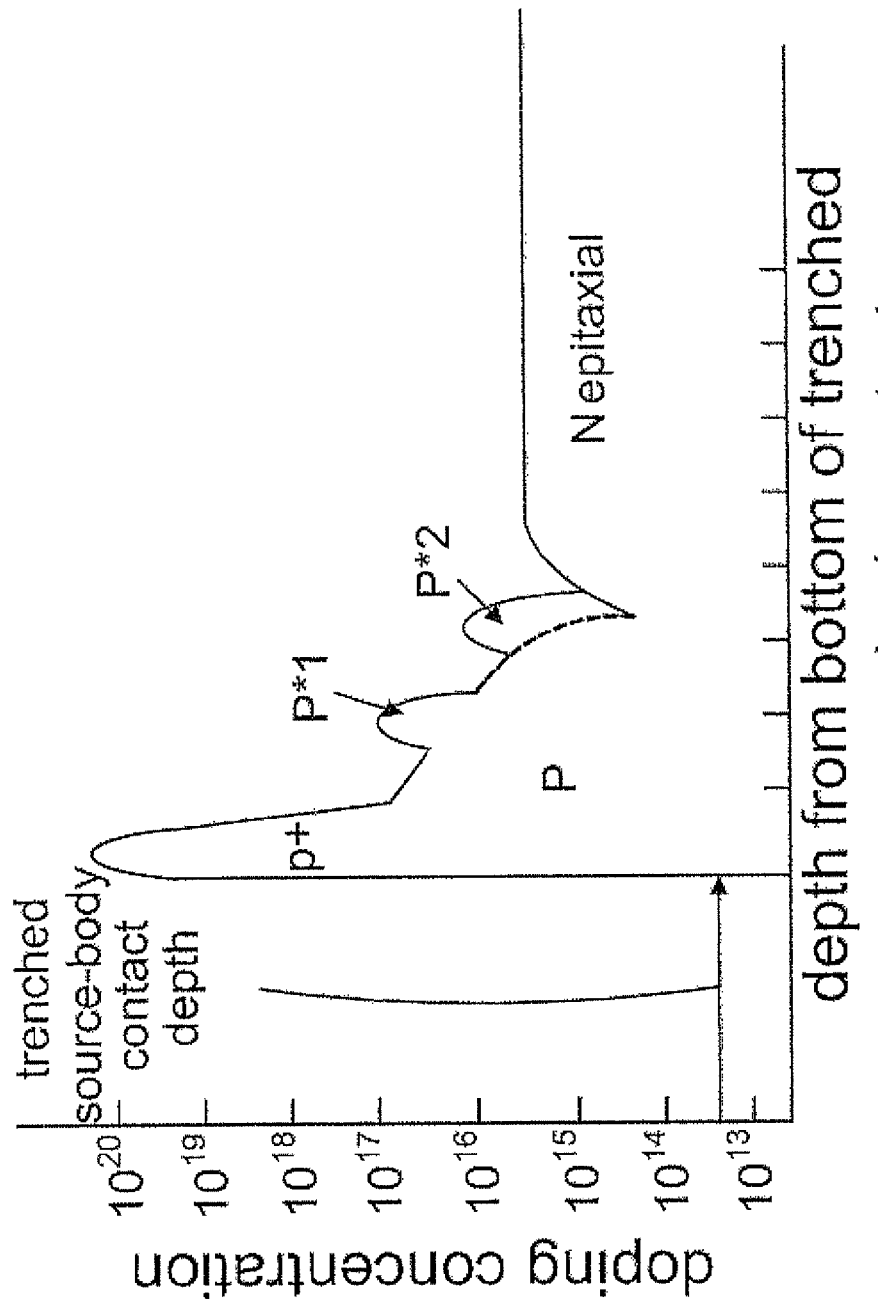
FIG. 10 is a graph showing $Y_3$-$Y_3'$ cross section of FIG. 9.

Please refer to FIG. 9 for a cross sectional-view of another preferred N-channel trench MOSFET which is similar to that in FIG. 4 except that, underneath the p+ body ohmic contact doped region 416, there are two avalanche capability enhancement region: P*1 and P*2, wherein the P*1 avalanche capability enhancement doped region 418 is formed completely within the P body region 406, and the P*2 avalanche capability enhancement doped region 418' is formed partially overlap with the P body region 406 and partially extending into the N epitaxial layer 401 but shallower than the gate trenches 402.

Figure 11:
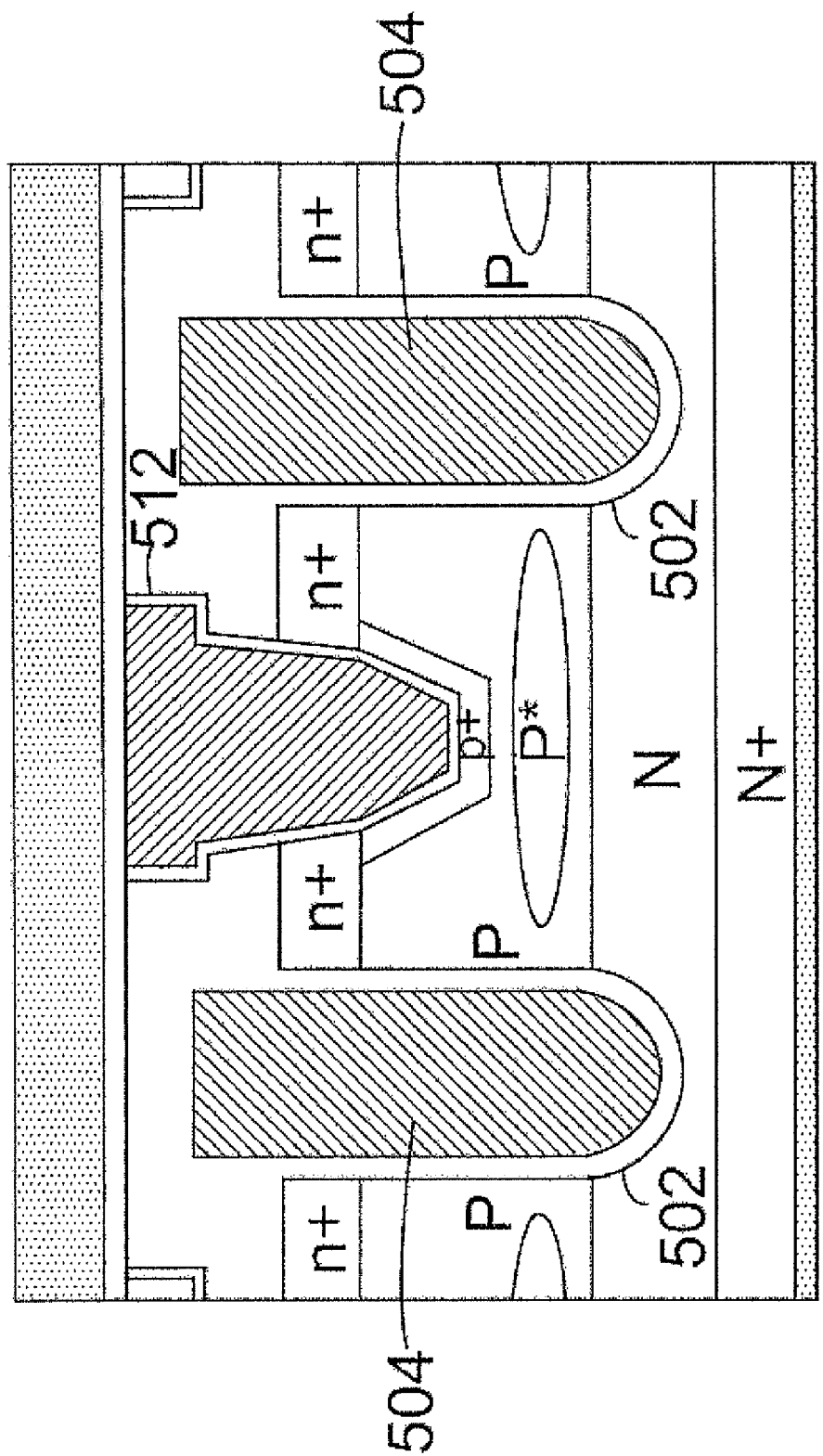
FIG. 11 is a side cross-sectional view of another preferred embodiment according to the present invention.

Please refer to FIG. 11 for a cross sectional-view of another preferred N-channel trench MOSFET which is similar to that in FIG. 4 except that, the doped poly-silicon 504 protrudes out from gate trenches 502, which means top surface of the doped poly-silicon 504 is higher than sidewalls of the gate trenches 502 to form terrace trenched gates for gate resistance reduction.

Figure 12:
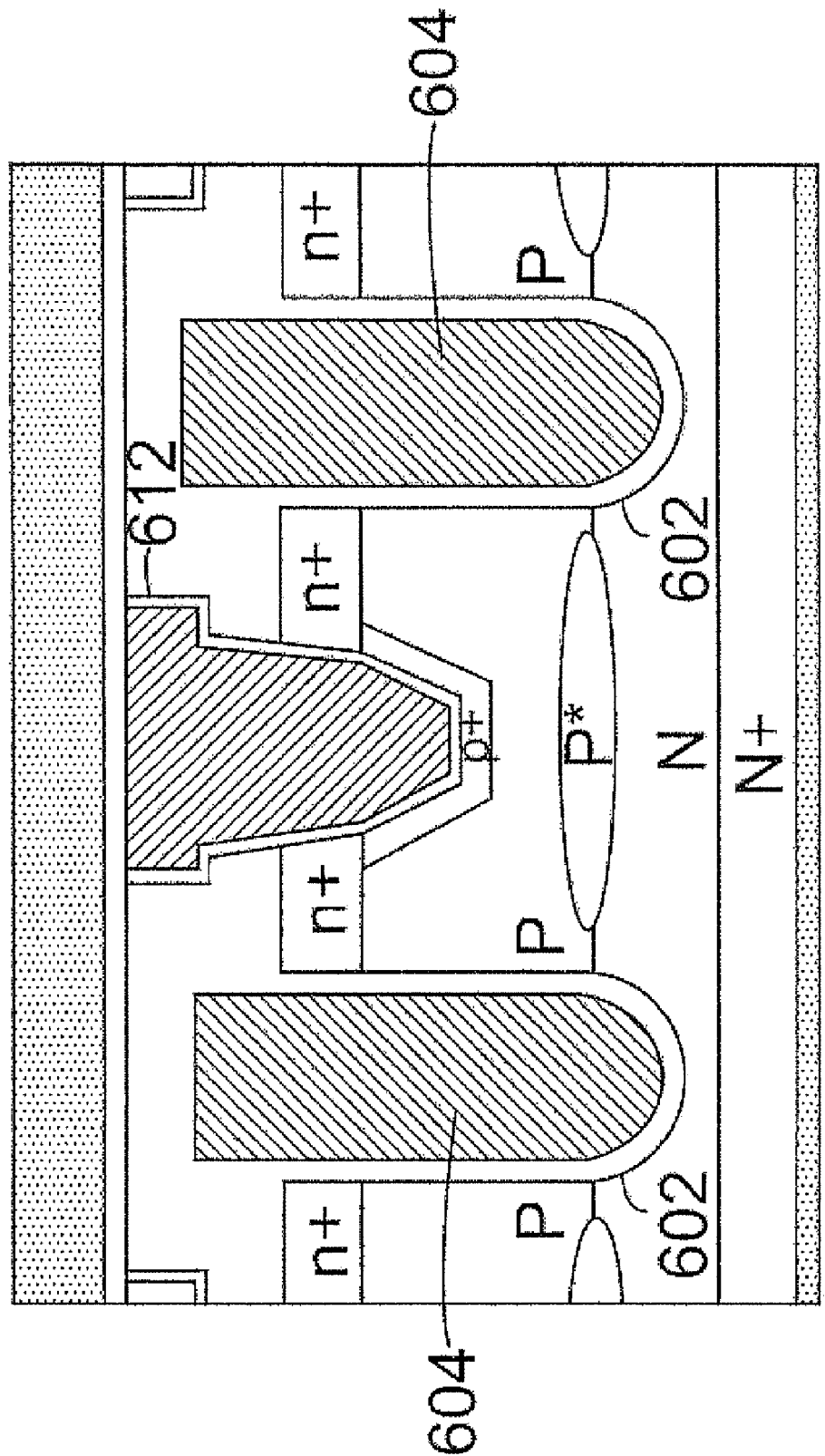
FIG. 12 is a side cross-sectional view of another preferred embodiment according to the present invention.

Please refer to FIG. 12 for a cross sectional-view of another preferred N-channel trench MOSFET which is similar to that in FIG. 8 except that, the doped poly-silicon 604 protrudes out from gate trenches 602, which means top surface of the doped poly-silicon 604 is higher than sidewalls of the gate trenches 602 to form terrace trenched gates for gate resistance reduction.

Figure 13:
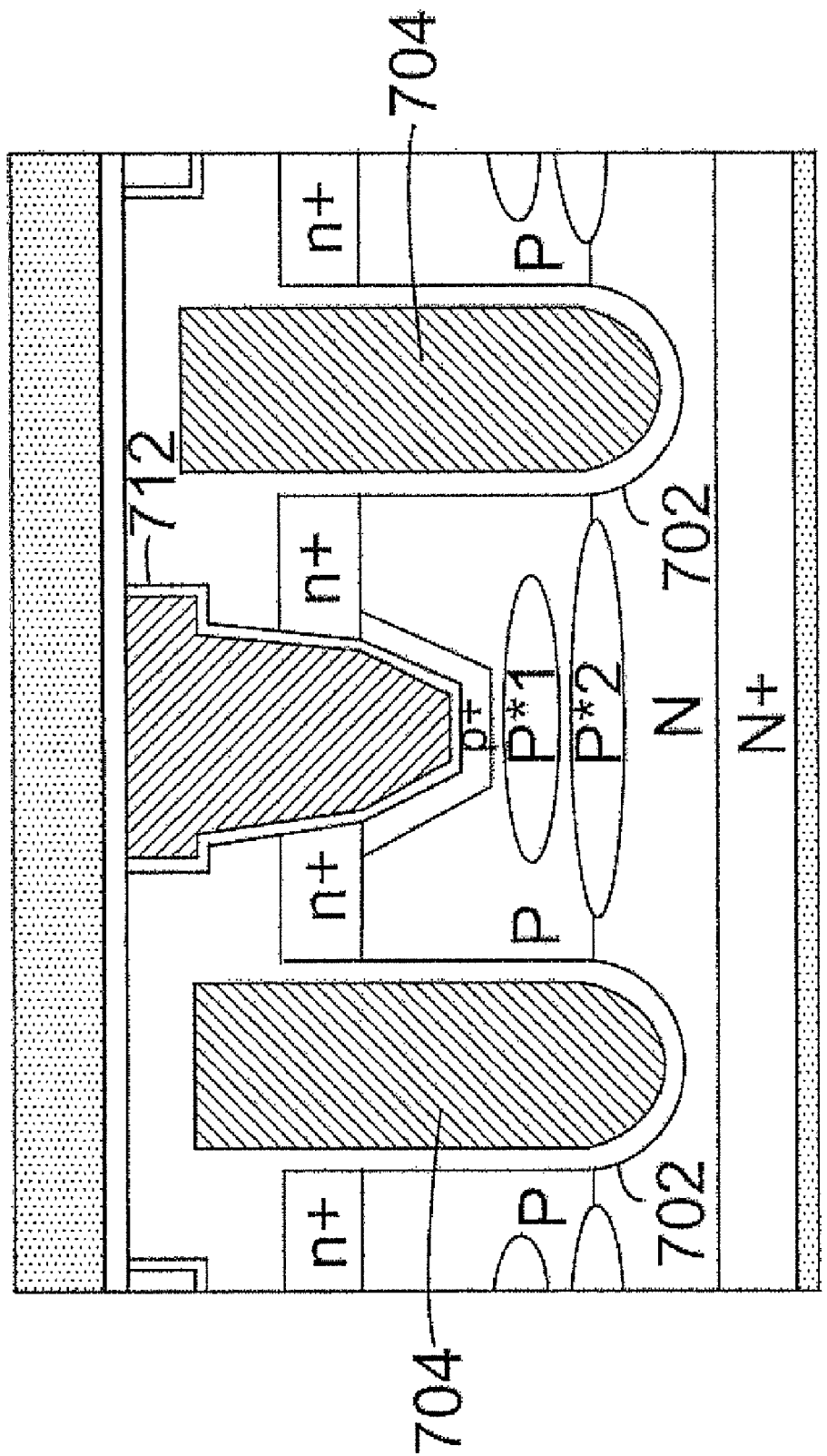
FIG. 13 is a side cross-sectional view of another preferred embodiment according to the present invention.

Please refer to FIG. 13 for a cross sectional-view of another preferred N-channel trench MOSFET which is similar to that in FIG. 9 except that, the doped poly-silicon 704 protrudes out from gate trenches 702, which means top surface of the doped poly-silicon 704 is higher than sidewalls of the gate trenches 702 to form terrace trenched gates for gate resistance reduction.

Figure 14:
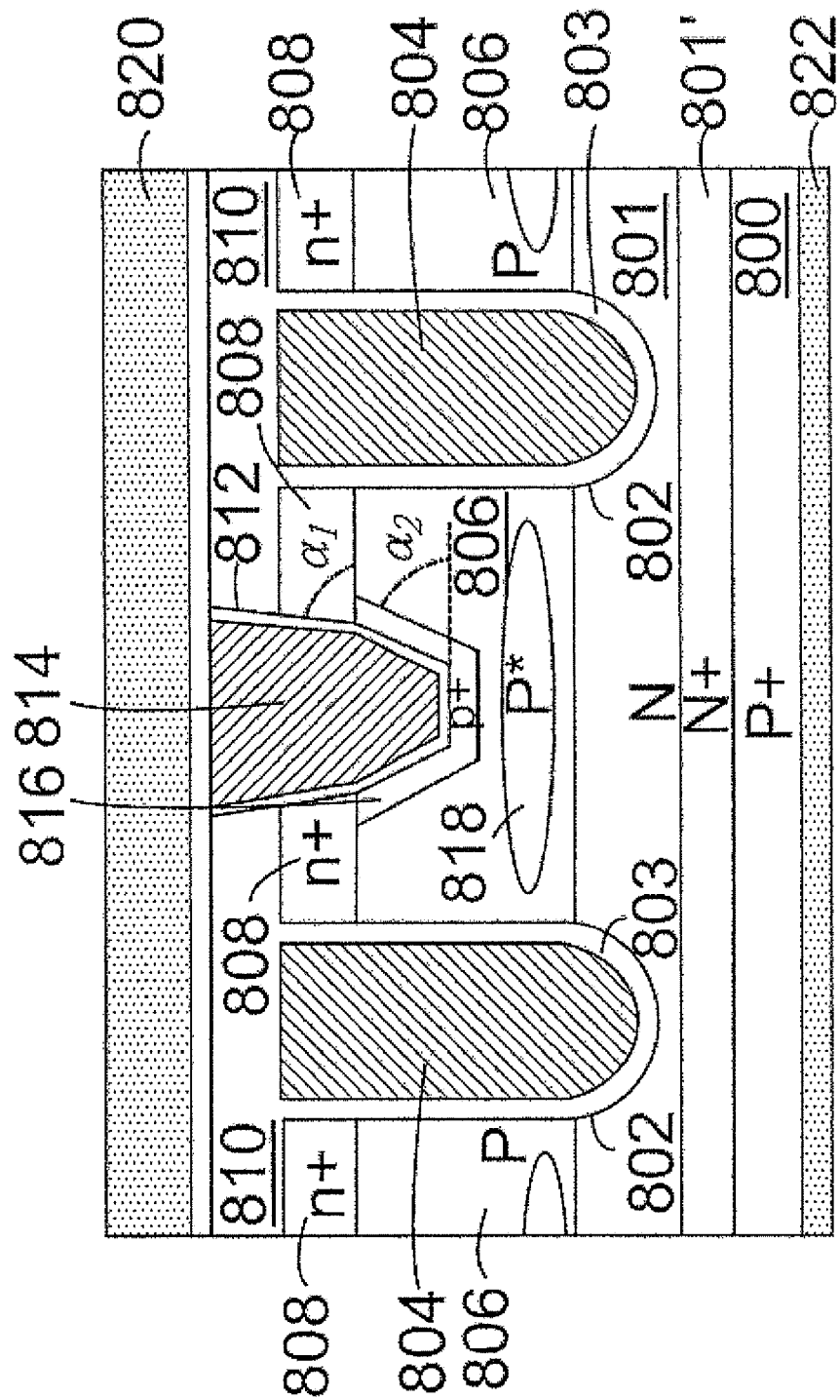
FIG. 14 is a side cross-sectional view of another preferred embodiment according to the present invention.

Please refer to FIG. 14 for a cross sectional-view of a preferred N-channel trench IGBT which formed on a P+ substrate 800 with back metal 822 of Ti/Ni/Ag on rear side as collector electrode. Onto said P+ substrate 800, a first N+ epitaxial layer 810' and a second N epitaxial layer 801 is successively grown, and a plurality of trenched gates are formed inside said second N epitaxial layer 801. The trenched gates further comprises: a plurality of gate trenches 802; a gate oxide layer 803 lining the inner surface of each of said gate trenches 802; a doped poly-silicon layer 804 filled in each of said gate trenches 802, wherein top surface of said doped poly-silicon layer 804 not higher than sidewalls of said gate trenches 802. The preferred N-channel trench IGBT further comprises: P base regions 806 formed in upper portion of said second N epitaxial layer 801 and extending between every two adjacent of said gate trenches 802; n+ emitter regions 808 near top surface of said P base regions 806 and surrounding the sidewalls of said gate trenches 802; an insulation layer serving as contact interlayer 810 covering top surface of said second N epitaxial layer 801 and said doped poly-silicon layer 804; a plurality of trenched emitter-base contacts including a plurality of emitter-base contact trenches 812 and a plurality of tungsten plugs 814 therein, wherein each of said tungsten plugs 814 is padded by a barrier layer of Ti/TiN or Co/TiN or Ta/TiN. Specifically, each of said emitter-base contact trenches has slope sidewall penetrating through said contact interlayer 810 and said n+ emitter regions 808 with taper angle $\alpha_1$', and extending into said P base regions with taper angle $\alpha_2$', wherein $\alpha_1$' is less than 90 degree and greater than $\alpha_2$'. Therefore, underneath each of said emitter-base contact trenches 812, a p+ base ohmic contact doped region 816 is surrounding its bottom and the sidewall with taper angle $\alpha_2$' due to the enlargement of implantation area. According to the present invention, in this preferred embodiment, there is only one P avalanche capability enhancement doped region P* 818 underneath said p+ base ohmic contact doped region 816 and completely within said P base regions 806 to shift avalanche occurrence from bottom of said gate trenches to underneath said emitter-base contact trenches. Onto said contact interlayer 810 and said tungsten plugs 814, a front metal of Al alloys or Cu alloys is deposited acting as emitter metal 820 to be connected to said n+ emitter regions 808 and said P base regions 806 via said tungsten plugs 814, wherein said emitter metal 820 is padded by a resistance-reduction layer of Ti or Ti/TiN beneath.

Figure 15:
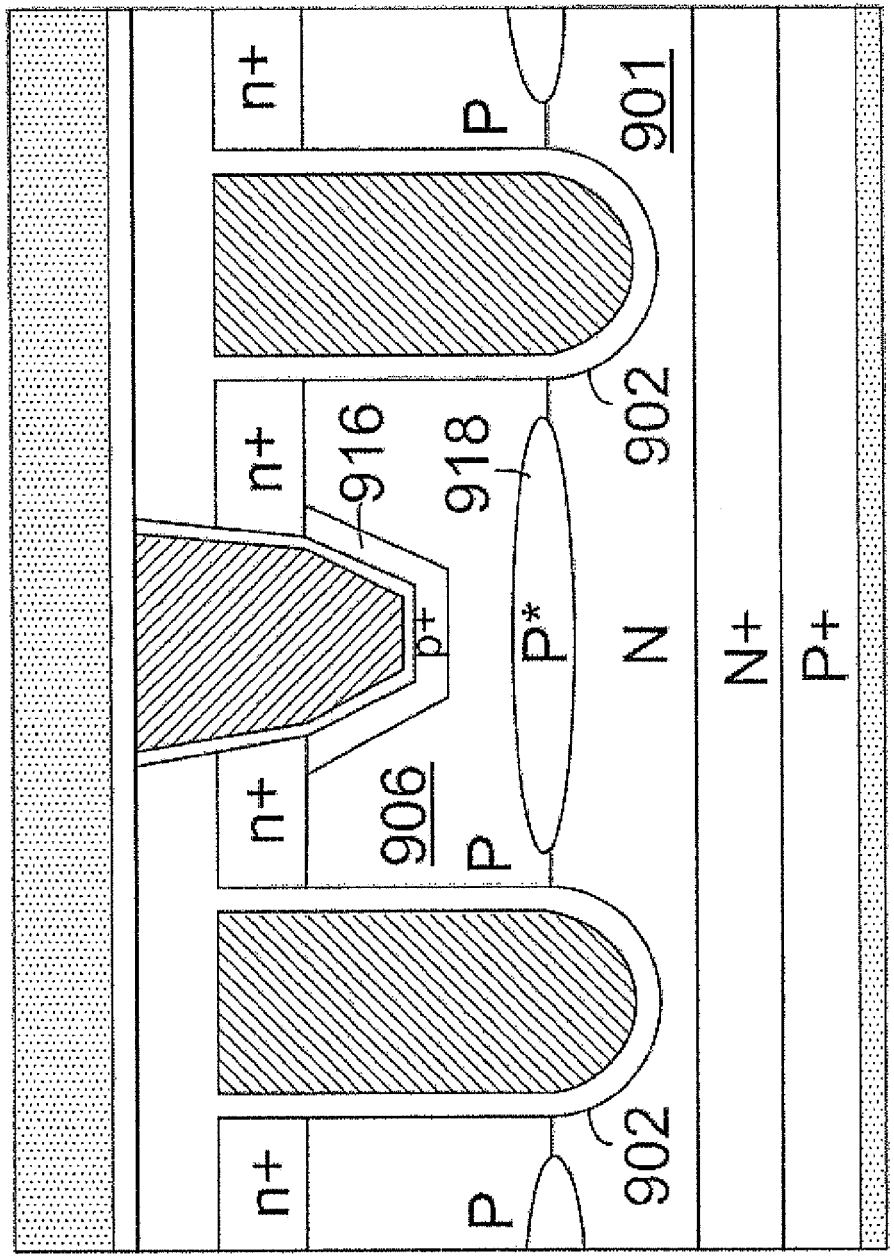
FIG. 15 is a side cross-sectional view of another preferred embodiment according to the present invention.

Please refer to FIG. 15 for a cross sectional-view of another preferred N-channel trench IGBT which is similar to that in FIG. 14 except that, underneath the p+ base ohmic contact doped region 916, the P* avalanche capability enhancement doped region 918 is formed partially overlap with the P base region 906 and partially extending into the second N epitaxial layer 901 but shallower than the gate trenches 902.

Figure 16:
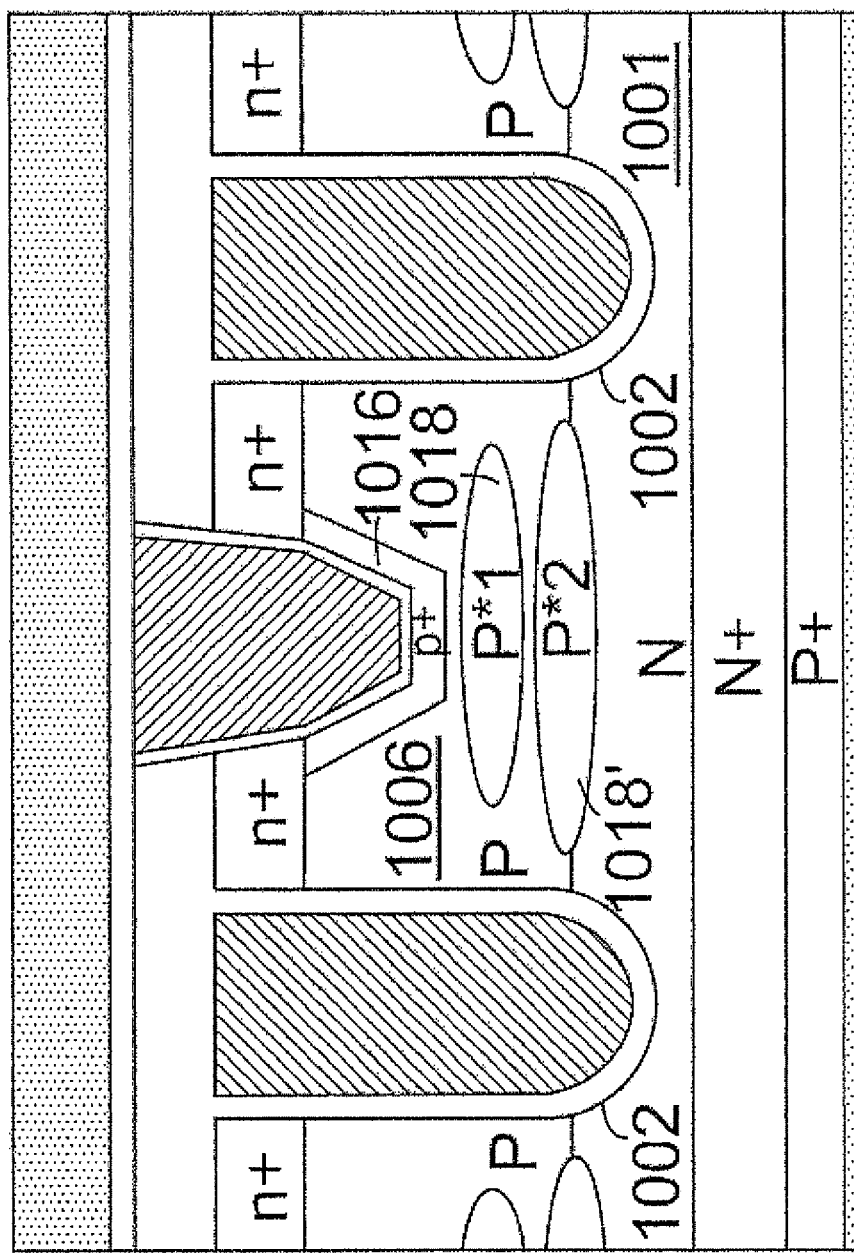
FIG. 16 is a side cross-sectional view of another preferred embodiment according to the present invention.

Please refer to FIG. 16 for a cross sectional-view of another preferred N-channel trench IGBT which is similar to that in FIG. 14 except that, underneath the p+ base ohmic contact doped region 1016, there are two avalanche capability enhancement doped regions: P*1 and P*2, wherein the P*1 avalanche capability enhancement doped region 1018 is formed completely within the P base region 1006, and the P*2 avalanche capability enhancement doped region 1018' is formed partially overlap with the P base region 1006 and partially extending into the second N epitaxial layer 1001 but shallower than the gate trenches 1002.

Figure 17:
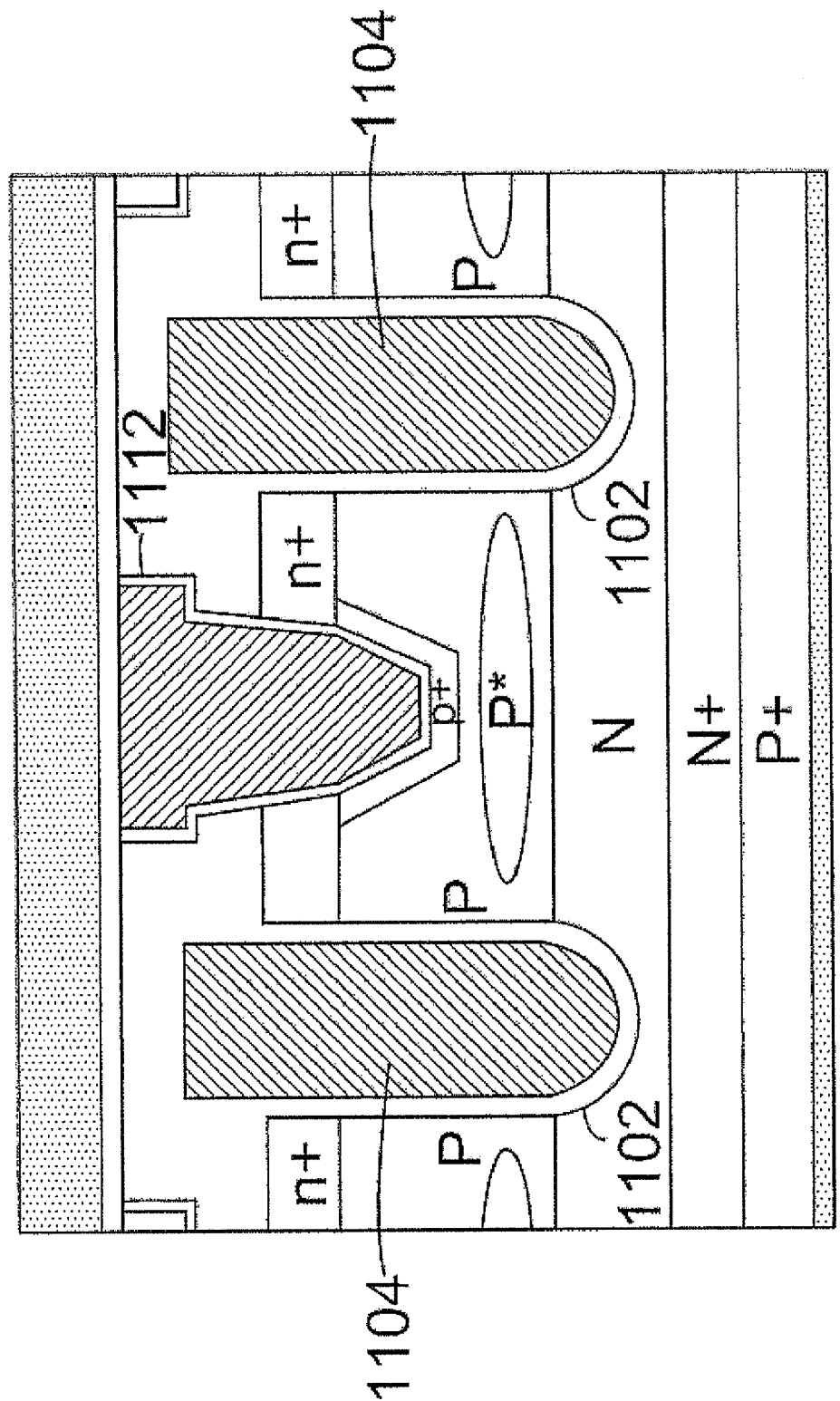
FIG. 17 is a side cross-sectional view of another preferred embodiment according to the present invention.

Please refer to FIG. 17 for a cross sectional-view of another preferred N-channel trench IGBT which is similar to that in FIG. 14 except that, the doped poly-silicon 1104 protrudes out from gate trenches 1102, which means top surface of the doped poly-silicon 1104 is higher than sidewalls of the gate trenches 1102 to form terrace trenched gates for gate resistance reduction.

Figure 18:
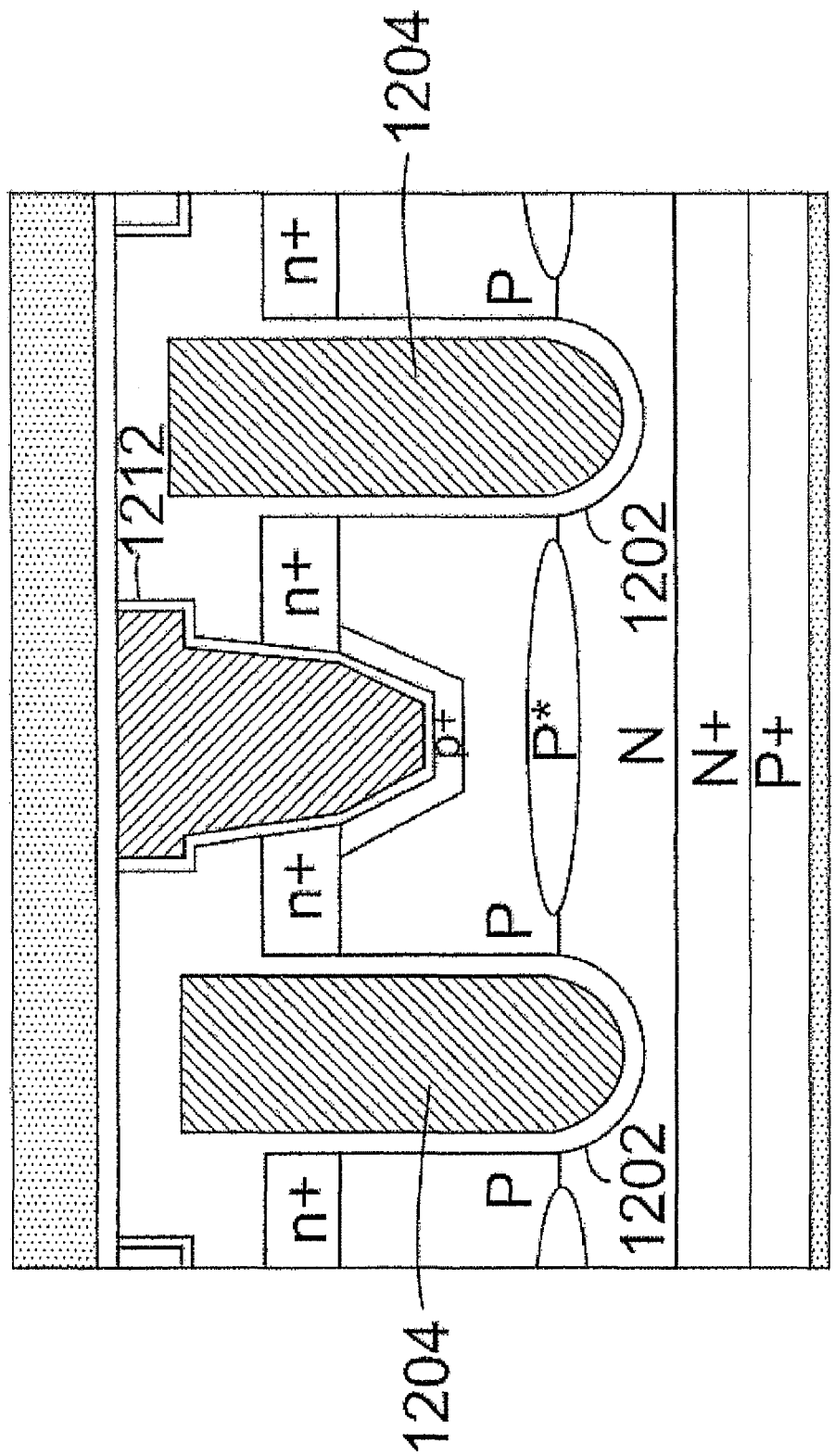
FIG. 18 is a side cross-sectional view of another preferred embodiment according to the present invention.

Please refer to FIG. 18 for a cross sectional-view of another preferred N-channel trench IGBT which is similar to that in FIG. 15 except that, the doped poly-silicon 1204 protrudes out from gate trenches 1202, which means top surface of the doped poly-silicon 1204 is higher than sidewalls of the gate trenches 1202 to form terrace trenched gates for gate resistance reduction.

Figure 19:
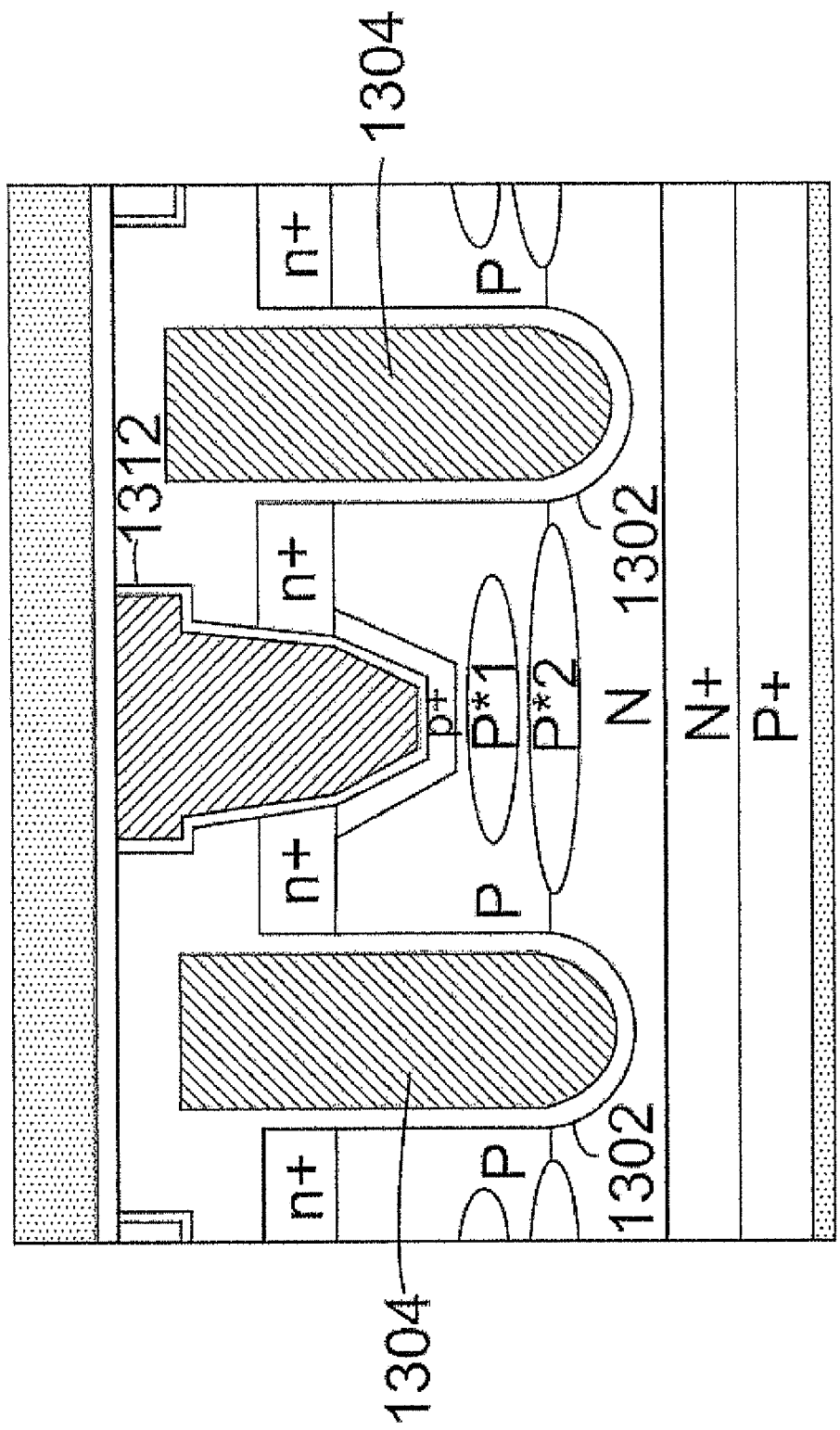
FIG. 19 is a side cross-sectional view of another preferred embodiment according to the present invention.

Please refer to FIG. 19 for a cross sectional-view of another preferred N-channel trench IGBT which is similar to that in FIG. 16 except that, the doped poly-silicon 1304 protrudes out from gate trenches 1302, which means top surface of the doped poly-silicon 1304 is higher than sidewalls of the gate trenches 1302 to form terrace trenched gates for gate resistance reduction.

Figure 20A:
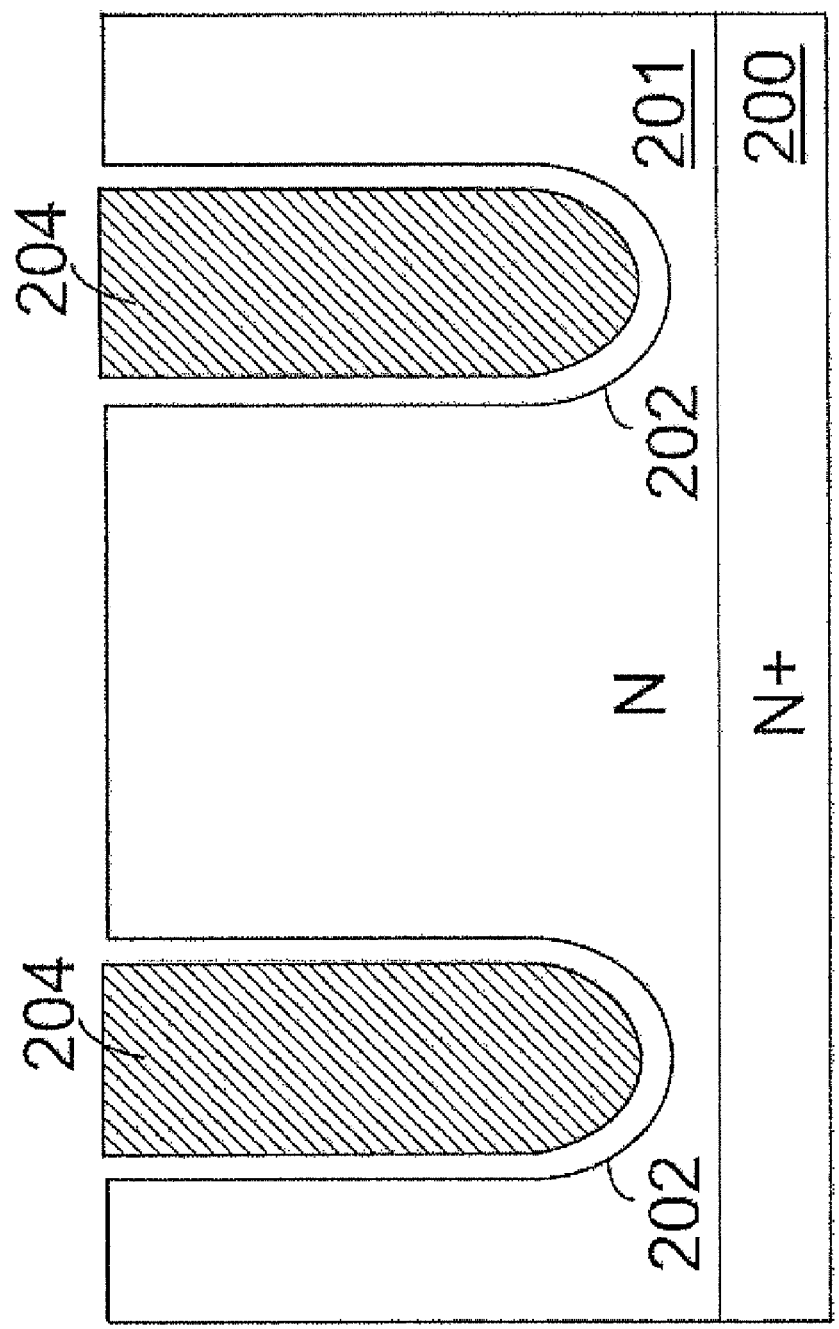
FIGS. 20A-20E are a serial of side cross-sectional views for showing the processing steps for fabricating the trench MOSFET as shown in FIG. 4.

FIGS. 20A to 20E are a serial of exemplary steps that are performed to form the preferred N-channel trench MOSFET in FIG. 4. In FIG. 20A, an N doped epitaxial layer 201 is first grown on an N+ substrate 200. After applying a trench mask (not shown), a plurality of gate trenches 202 are trenched to a certain depth into said N epitaxial layer 201. Then, a sacrificial oxide layer is grown and then removed to eliminate the plasma damage may introduced during etching process. Next, an oxide layer is grown overlying the inner surface of said gate trenches 202 to serve as gate oxide 203, onto which doped poly-silicon layer 204 is deposited such that said doped poly-silicon layer 204 overflows onto top surface of said epitaxial layer 201. Then, said doped poly-silicon layer 204 is etched by CMP (Chemical Mechanical Polishing) or plasma etching back to be removed away from top surface of said epitaxial layer 201.

Figure 20B:
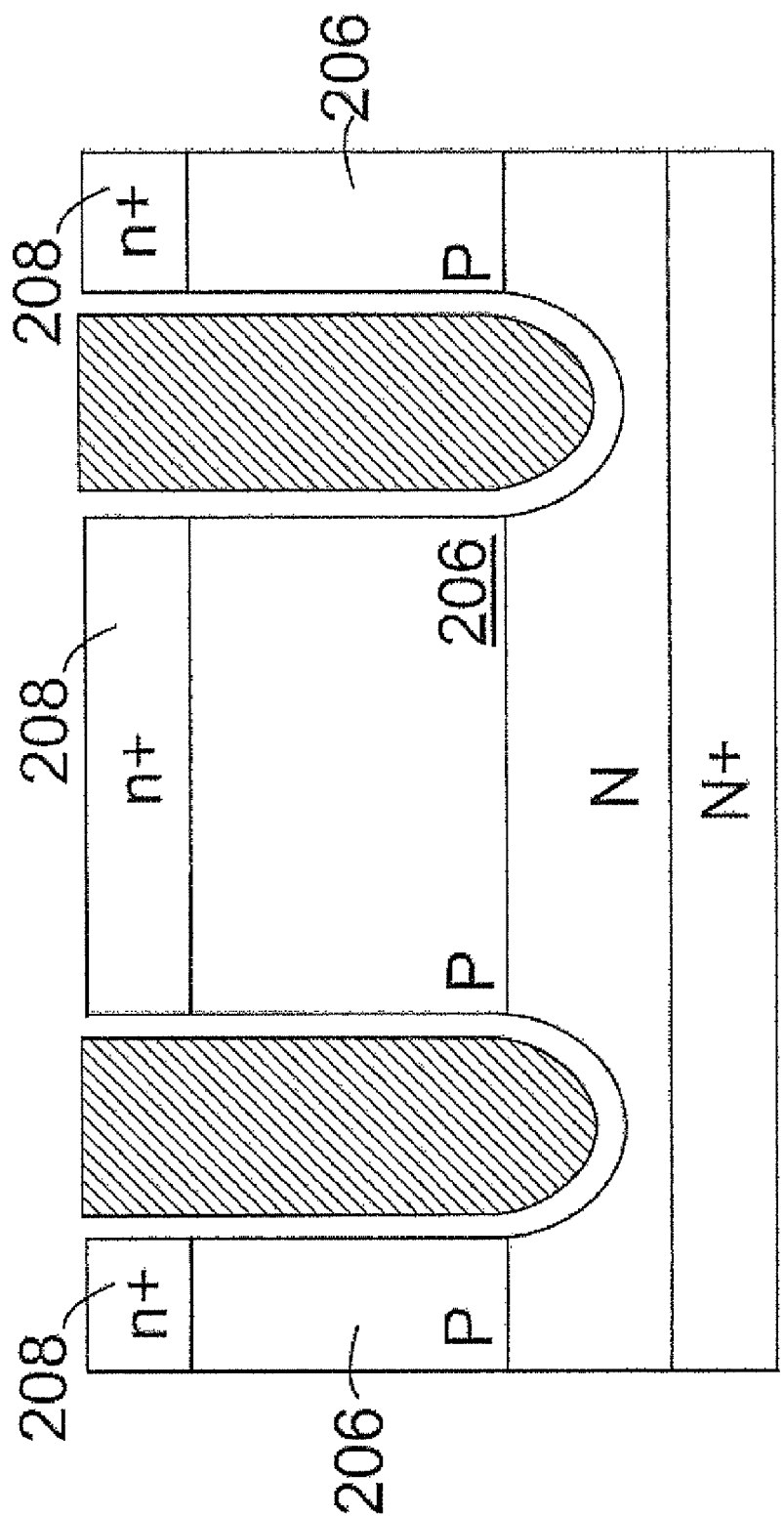

In FIG. 20B, a P body mask (not shown) is optionally used for the following P type dose implantation, then, the step of P type pose diffusion is performed to form P body regions 206. After that, a source mask (not shown) is applied and a step of n+ type dose is implanted for the formation of n+ source regions 208 followed by diffusion.

Figure 20C:
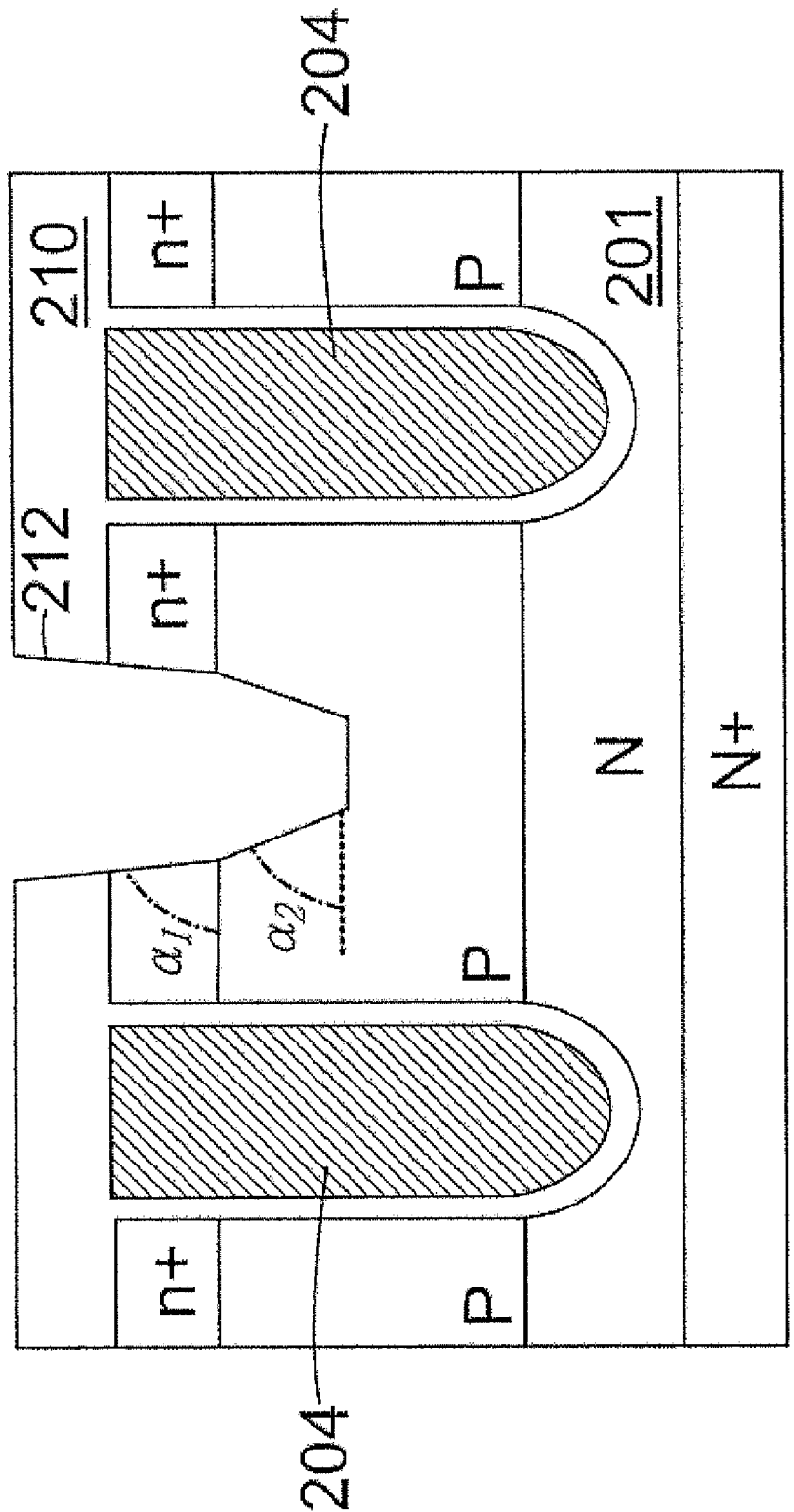

In FIG. 20C, another insulation layer is deposited onto top surface of said epitaxial layer 201 and said doped poly-silicon layer 204 to serve as contact interlayer 210. Then, after a contact mask (not shown) is applied onto said contact interlayer 210, a plurality of source-body contact trenches 212 are formed by etching through said contact interlayer 210, said n+ source regions 208 and etching into said P body regions 206 with slope sidewalls. Specifically, the slope sidewalls within said contact interlayer 210 and said n+ source regions 208 are etched with taper angle $\alpha_1$, and the slope sidewalls in said P body regions 208 are etched with taper angle $\alpha_2$, and $\alpha_1$ is less than 90 degree but greater than $\alpha_2$.

Figure 20D:
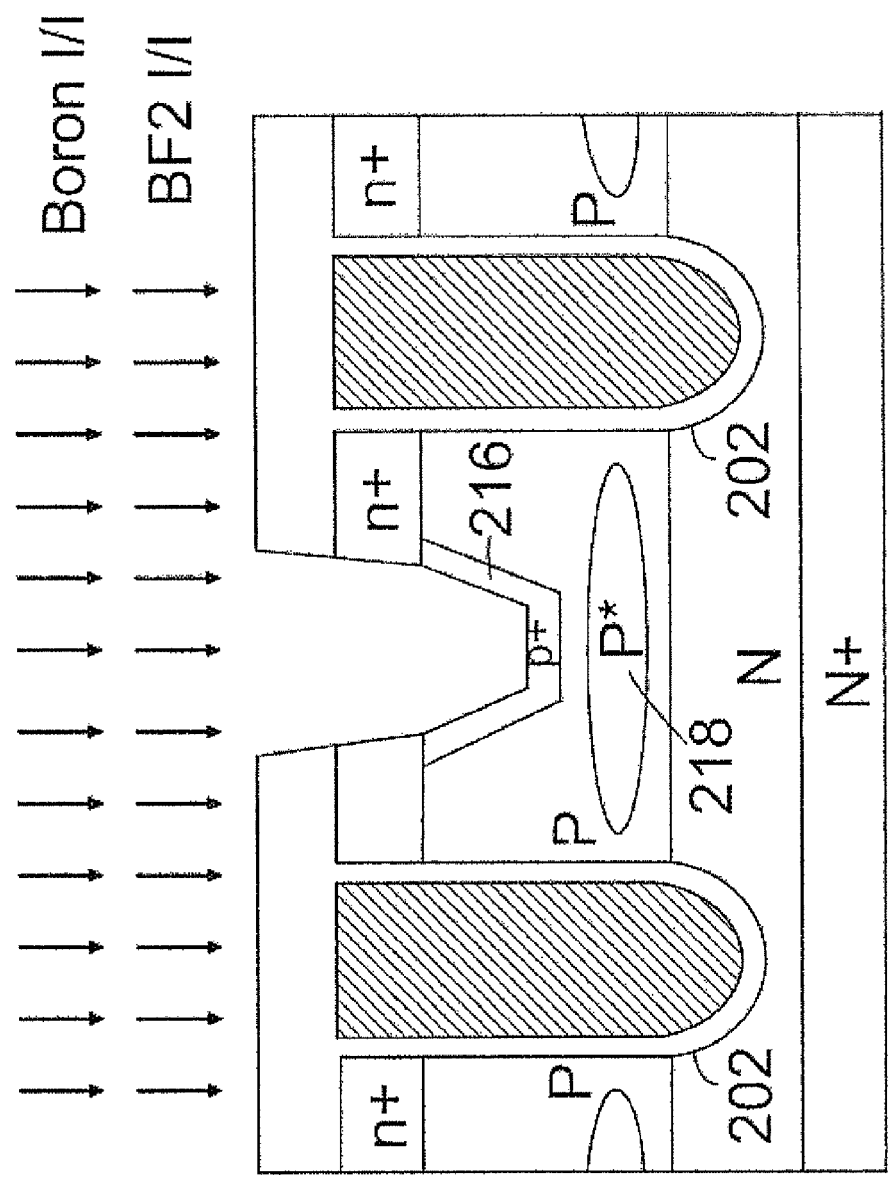

In FIG. 20D, after removing said contact mask, a BF2 ion implantation is carried out to form a p+ body ohmic contact doped region 216 underneath each of said source-body contact trenches and wrapping its bottom as well as its sidewalls encompassed in said P body regions 206. Then, a Boron ion implantation is carried out with dose from $1E12$ $cm^{-2}$ to $1E14$ $cm^{-2}$ and with energy ranging from 100 KeV to 300 KeV to form a P* avalanche capability enhancement doped region 218 underneath each said p+ body ohmic contact doped region and not touching with channel regions near said gate trenches 202.

Figure 20E:
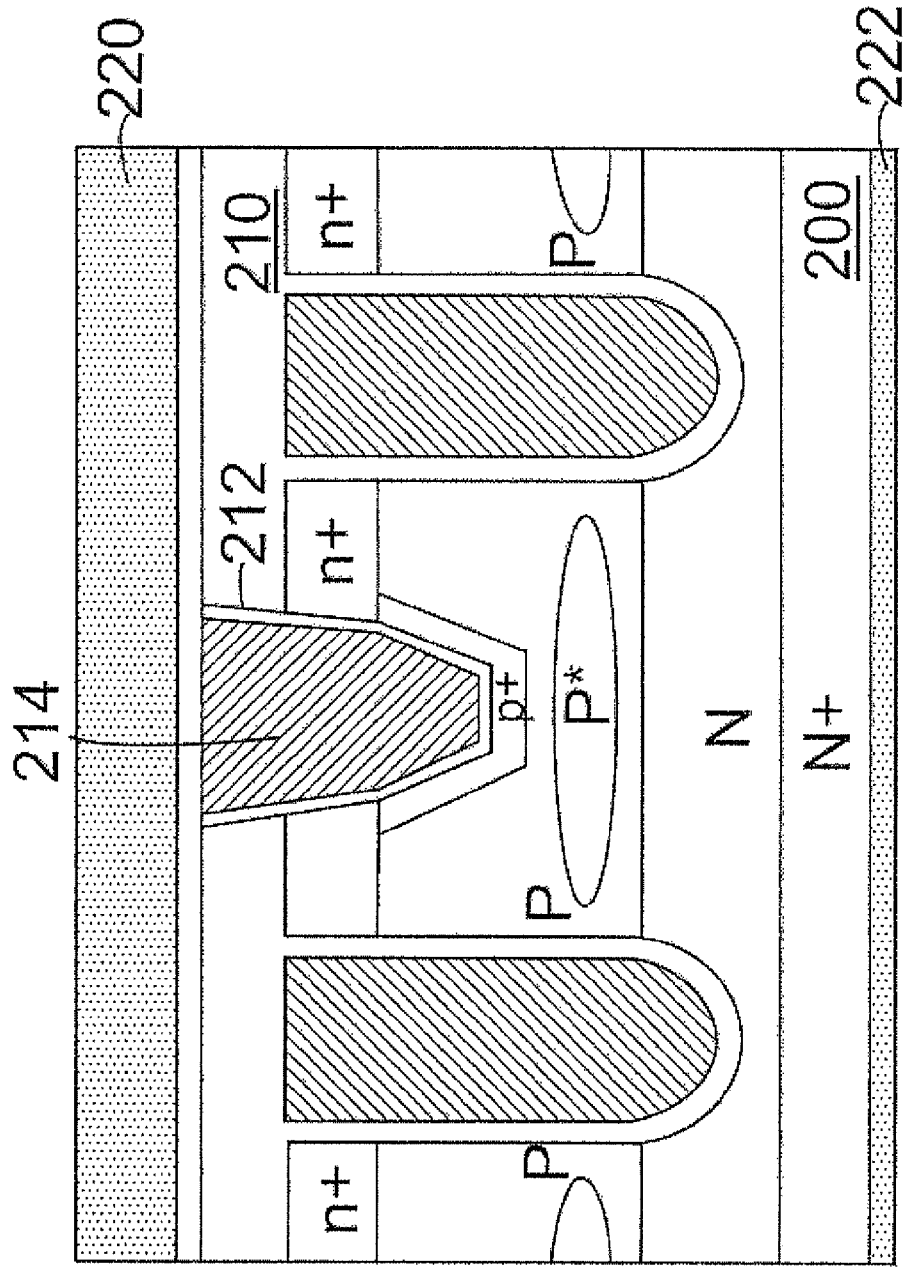

In FIG. 20E, after activating the implanted dopant in FIG. 20D, a barrier layer of Ti/TiN or Co/TiN or Ta/TiN is deposited along inner surface of each of said source-body contact trenches 212, onto which, tungsten material is deposited and then etched back to form a tungsten plug 214 within each of said source-body contact trenches 212. Next, a metal layer of Al alloys or Cu alloys is deposited padded by a resistance-reduction layer Ti or Ti/TiN and over said contact interlayer 210 as well as each said tungsten plug 214 to serve as source metal 220. Last, after backside grinding, drain metal 222 of Ti/Ni/Ag is deposited onto rear side of said N+ substrate 200.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A power semiconductor device comprising a plurality of trench IGBTs, wherein each of said trench IGBTs further comprising:
   a first epitaxial layer of a first conductivity type over a substrate of a second conductivity type;
   a second epitaxial layer of said first conductivity type over said first epitaxial layer, wherein said second epitaxial layer has a lower doping concentration than said first epitaxial layer;
   a plurality of gate trenches extending into said epitaxial layer, wherein each of said gate trenches has a first insulation layer lining its inner surface and a doped poly-silicon layer thereon;
   a base region of said second conductivity type surrounding sidewall of each of said gate trenches between every two adjacent of said gate trenches;
   an emitter region of said first conductivity type near top surface of said base region, wherein said emitter region surrounds top portion of sidewall of each of said gate trenches, and has a higher doping concentration than said second epitaxial layer;
   a second insulation layer disposed over said second epitaxial layer and covering outer surface of said doped poly-silicon layer;
   an emitter-base contact trench locating between every two adjacent of said gate trenches, opened through said second insulation layer and said emitter region, and extended into said base region;
   a base ohmic contact doped region of said second conductivity type formed within said base region surrounding at least bottom of each said emitter-base contact trench and having a higher doping concentration than said base region;
   at least an avalanche capability enhancement doped region of said second conductivity type underneath each said base ohmic contact doped region, wherein said avalanche capability enhancement doped region has a higher doping concentration than said base region but a lower doping concentration than said base ohmic contact doped region;
   a metal plug filling in each said emitter-base contact trench;
   an emitter metal disposed covering top surface of said second insulation layer; and
   a collector metal disposed on rear side of said substrate.

2. The power semiconductor device claim 1, wherein there is only one said avalanche capability enhancement doped region underneath each said base ohmic contact doped region, wherein said avalanche capability enhancement doped region is formed completely within said base regions.

3. The power semiconductor power device of claim 1, wherein there is only one said avalanche capability enhancement doped region underneath each said base ohmic contact doped region, wherein said avalanche capability enhancement doped region is formed partially overlap with said base region and partially extending into said second epitaxial layer but shallower than said gate trenches.

4. The power semiconductor power device of claim 1, wherein there are two avalanche capability enhancement doped regions, and one of which is formed overlap with said base region and partially extending into said epitaxial layer but shallower than said gate trenches, and another is formed within said base region.

5. The power semiconductor power device of claim 1, wherein there are multiple of avalanche capability enhancement doped regions, and one of which is formed overlap with said base region and partially extending into said second epitaxial layer but shallower than said gate trenches, and others are formed within said base region.

6. The power semiconductor device of claim 1, wherein said doped poly-silicon layer protrudes out from each of said gate trenches and at least a portion of said doped poly-silicon is positioned higher than sidewall of each of said gate trenches.

7. The power semiconductor device of claim 1, wherein top surface of said doped poly-silicon layer is not higher than sidewall of each of said gate trenches.

8. The power semiconductor device of claim 1, wherein each said emitter-base contact trench has sidewalls with taper angle $\alpha_1$ within said emitter region, and has sidewalls with taper angle $\alpha_2$ in said base region with respect to top surface of said second epitaxial layer, wherein said taper angle $\alpha_1$ is equal to or less than 90 degree and said taper angle $\alpha_1$ is equal to or greater than said taper angle $\alpha_2$.

9. The power semiconductor device of claim 1, wherein said metal plug is tungsten plug padded by a barrier layer of Ti/TiN or Co/TiN or Ta/TiN.

10. The power semiconductor device of claim 9, wherein said emitter metal is Cu alloys or Al alloys padded by a resistance-reduction layer of Ti or Ti/TiN which covering the top surface of said second insulation layer and each said tungsten plug.

11. The power semiconductor device of claim 1, wherein said metal plug is said emitter metal directly filling into each said emitter-base contact trench.

12. The power semiconductor device of claim 11, wherein said emitter metal is Cu alloys or Al alloys padded by a barrier layer of Ti/TiN or Co/TiN or Ta/TiN.

13. The power semiconductor device of claim 1, wherein said collector metal is Ti/Ni/Ag.

* * * * *